(12) United States Patent
Zang

(10) Patent No.: US 12,034,027 B2
(45) Date of Patent: Jul. 9, 2024

(54) SEMICONDUCTOR DEVICE CONTACT PAD AND METHOD OF CONTACT PAD FABRICATION

(71) Applicant: OMNIVISION TECHNOLOGIES, INC., Santa Clara, CA (US)

(72) Inventor: Hui Zang, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 274 days.

(21) Appl. No.: 17/408,257

(22) Filed: Aug. 20, 2021

(65) Prior Publication Data

US 2023/0053960 A1 Feb. 23, 2023

(51) Int. Cl.
*H01L 27/146* (2006.01)

(52) U.S. Cl.
CPC .. *H01L 27/14632* (2013.01); *H01L 27/14636* (2013.01); *H01L 27/14645* (2013.01); *H01L 27/14687* (2013.01); *H01L 27/14698* (2013.01)

(58) Field of Classification Search
CPC ......... H01L 27/14632; H01L 27/14687; H01L 27/14636
See application file for complete search history.

(56) References Cited

U.S. PATENT DOCUMENTS

| | | | |
|---|---|---|---|
| 7,952,096 B2 | 5/2011 | Rhodes | |
| 8,071,429 B1 | 12/2011 | Qian et al. | |
| 8,119,435 B2 | 2/2012 | Brady | |
| 8,274,124 B2 | 9/2012 | Lin et al. | |
| 10,192,919 B2 | 1/2019 | Barr et al. | |
| 2010/0314619 A1* | 12/2010 | Kaltalioglu | H01L 22/34 257/E21.585 |
| 2021/0043593 A1* | 2/2021 | Huang | H01L 24/05 |

OTHER PUBLICATIONS

Zang, H., et al., "Metal Deep Trench Isolation Biasing Solution," U.S. Appl. No. 16/918,929, filed Jul. 1, 2020, 55 pages.

* cited by examiner

*Primary Examiner* — Mounir S Amer
*Assistant Examiner* — Alexander Belousov
(74) *Attorney, Agent, or Firm* — Christensen O'Connor Johnson Kindness PLLC

(57) ABSTRACT

A method for forming a contact pad of a semiconductor device is disclosed. The method includes providing a semiconductor substrate including a first side and a second side. The semiconductor device includes a shallow trench isolation structure, disposed between the first side and the second side, and an intermetal dielectric stack coupled to the second side. The intermetal dielectric stack includes a first metal interconnect. The method further includes etching a first trench into the semiconductor substrate, depositing a dielectric material into the first trench to form a dielectric spacer extending along side walls of the first trench, etching a second trench aligned with the first trench, and depositing a metal material into the second trench to form the contact pad that contacts the first metal interconnect.

19 Claims, 16 Drawing Sheets

100-A

105 — PROVIDING A SEMICONDUCTOR SUBSTRATE OF A SEMICONDUCTOR DEVICE, THE SEMICONDUCTOR SUBSTRATE INCLUDING A FIRST SIDE, A SECOND SIDE, AND A SHALLOW TRENCH ISOLATION (STI) STRUCTURE DISPOSED BETWEEN THE FIRST SIDE AND THE SECOND SIDE, AND WHEREIN THE SEMICONDUCTOR DEVICE FURTHER INCLUDING AN INTERMETAL DIELECTRIC STACK COUPLED TO THE SECOND SIDE AND A FIRST METAL INTERCONNECT INCLUDED IN THE INTERMETAL DIELECTRIC STACK

110 — DEPOSITING AN ETCH STOP LAYER ON THE SEMICONDUCTOR SUBSTRATE, WHEREIN THE FIRST SIDE OF THE SEMICONDUCTOR SUBSTRATE IS DISPOSED BETWEEN THE ETCH STOP LAYER AND THE STI STRUCTURE

115 — ETCHING A FIRST TRENCH INTO THE SEMICONDUCTOR SUBSTRATE DURING A FIRST ETCHING STEP, WHEREIN THE FIRST TRENCH EXTENDS FROM THE FIRST SIDE OF THE SEMICONDUCTOR SUBSTRATE TO THE STI STRUCTURE

120 — DEPOSITING A DIELECTRIC MATERIAL INTO THE FIRST TRENCH DURING A DIELECTRIC DEPOSITION STEP TO FORM A DIELECTRIC SPACER EXTENDING ALONG SIDEWALLS OF THE FIRST TRENCH

125 — ANISOTROPICALLY ETCHING THE DIELECTRIC MATERIAL, WHEREIN THE ANISOTROPIC ETCH STEP REMOVES THE DIELECTRIC MATERIAL COATING THE ETCH STOP LAYER AND AN EXPOSED REGION OF THE STI STRUCTURE TO FORM THE DIELECTRIC SPACER

130 — ETCHING A SECOND TRENCH ALIGNED WITH THE FIRST TRENCH DURING A SECOND ETCHING STEP BASED, AT LEAST IN PART, ON THE DIELECTRIC SPACER, WHEREIN THE SECOND TRENCH EXTENDS THROUGH THE STI STRUCTURE TO THE FIRST METAL INTERCONNECT

135 — DEPOSITING A METAL MATERIAL INTO THE SECOND TRENCH DURING A METAL DEPOSITION STEP TO FORM A CONTACT PAD OF THE SEMICONDUCTOR DEVICE, WHEREIN THE CONTACT PAD CONTACTS THE FIRST METAL INTERCONNECT

140 — ETCHING THE METAL MATERIAL TO REMOVE EXCESS PORTIONS OF THE METAL MATERIAL CONTACTING THE ETCH STOP LAYER AND FURTHER REMOVE A PORTION OF THE METAL MATERIAL LATERALLY SURROUNDED BY THE DIELECTRIC SPACER TO FORM THE CONTACT PAD

FIG. 1A

SEMICONDUCTOR DEVICE CONTACT PAD AND METHOD OF CONTACT PAD FABRICATION

TECHNICAL FIELD

This disclosure relates generally to semiconductor devices, and in particular but not exclusively, relates to contact pad formation of semiconductor devices.

BACKGROUND INFORMATION

Semiconductor devices are typically fabricated using a semiconductor substrate or wafer that includes at least two processing stages, which are generally referred to as front end of line (FEOL) and back end of line (BEOL) processing stages. During the FEOL stage, structures or components of the semiconductor device that reside within the semiconductor substrate or wafer are formed. For example, an image sensor is a semiconductor device that includes one or more photodiodes, floating diffusion, source/drain electrodes for transistors, isolation structures and the like, which are formed within the semiconductor substrate of the image sensor during the FEOL processing stage. During the BEOL processing stage, metallization occurs in which interconnects are fabricated that electrically interconnect components formed during the FEOL processing stage. Both the FEOL and BEOL processing stages typically utilize standard lithographic techniques to form their respective components, which may include a number of individual steps (e.g., photolithography, doping, etching, metal or dielectric deposition, chemical mechanical polishing, and the like).

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale; emphasis instead being placed upon illustrating the principles being described.

FIG. 1A illustrate an example process for manufacturing a contact pad of a semiconductor device, in accordance with the teachings of the present disclosure.

DETAILED DESCRIPTION

Figure 1B:
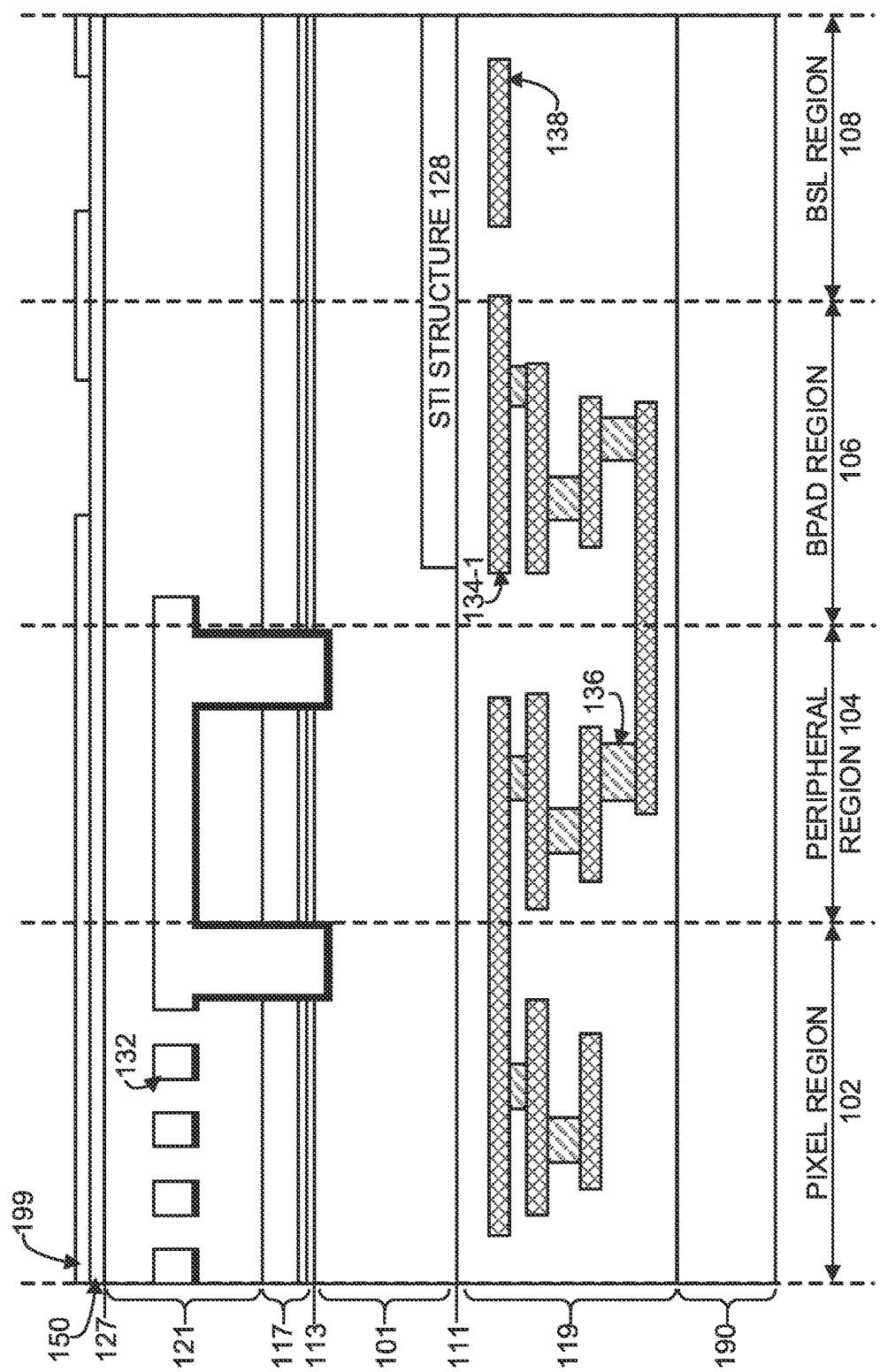
FIGS. 1B-1I illustrate example cross-sectional views of the semiconductor device during implementation of the process illustrated by FIG. 1A, in accordance with the teachings of the present disclosure.

Embodiments of an apparatus, system, and method each including or otherwise related to a contact pad of a semiconductor device are disclosed herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning. It is appreciated that the term "approximately" used within the specification may correspond to ±10% of a recited value. Additionally, it is further appreciated that the term "step" described in context of one or more process blocks discussed herein is not necessarily a singular step and may involve one or more substeps or subprocesses that collectively complete the given step.

Semiconductor devices are a ubiquitous part of modern technology with a diverse and varied functionally including, but not limited to, image sensors, processors, microcontrollers, memory, application specific integrated circuits, system-on-a-chip, other types of integrated circuits, and the like. However, as the functionality and complexity of semiconductor devices increases, there is an increasing demand to maintain or reduce manufacturing costs. One way to reduce manufacturing costs is to decrease the number of steps necessary to fabricate a given semiconductor device.

Disclosed herein are embodiments related to the formation of one or more contact pads of various semiconductor devices with a structure that may reduce the number of lithography steps during a BEOL process stage compared to conventional means. More specifically, embodiments described herein reduce the number of photomasks (e.g., reticles) needed to fabricate semiconductor device contact pads, which may advantageously reduce the overall manufacturing cost of the contact pad. A contact pad, alternatively referred to as a bonding pad or bond pad, corresponds to a designated area for forming electrical contact with one or more components of the semiconductor device, which may be for establishing an electrical connection with an external component or device. For example, embodiments disclosed herein are primarily discussed in the context of image sensor contact pads, which may provide electrical contact to one or more components of the image sensor (e.g., any one of, or a combination of, a photodiode, a source electrode, a drain electrode, a gate electrode, a floating diffusion, or the like for one or more image pixels, the associated control circuitry of the one or more pixels, or any other component of the image sensor). In one embodiment, one or more contact pads of the image sensor may be utilized to couple the image sensor to one or more microcontrollers or processors (e.g., for operation of the image sensor), memory (e.g., for storing image data), or otherwise.

It is appreciated that while embodiments disclosed herein are discussed in the context of image sensor contact pads, such embodiments are non-limiting. Rather, the method for forming a contact pad of a semiconductor device and the corresponding semiconductor device are not limited to image sensors, but instead are generally applicable to contact pads of semiconductor devices in accordance with the teachings of the present disclosure.

FIG. 1A illustrates an example process 100-A for manufacturing a contact pad of a semiconductor device and FIGS. 1B-1I illustrates example cross-sectional views of the semiconductor device during implementation of the process 100-A when the semiconductor device is an image sensor, in accordance with the teachings of the present disclosure. Referring back to FIG. 1A, it is appreciated that the numbered process blocks 105-140 may occur in any order and even in parallel. Additionally, blocks may be added to, or removed from, process 100-A in accordance with the teachings of the present disclosure.

Block 105 shows providing a semiconductor substrate (e.g., a silicon substrate or wafer) of a semiconductor device (e.g., image sensor, processor, microcontroller, memory, application specific integrated circuit, system-on-a-chip, other type of integrated circuit, or the like). The semiconductor substrate includes a first side (e.g., a back side), a second side (e.g., a front side) opposite the first side, and a shallow trench isolation (STI) structure (e.g., silicon dioxide) disposed within the semiconductor substrate between the first side and the second side. In some embodiments, the STI structure may be formed proximate to the second side of the semiconductor substrate and extend depth-wise toward the first side of the semiconductor substrate. The semiconductor device further includes an intermetal dielectric stack coupled to the second side of the semiconductor substrate. In some embodiments, the semiconductor device further includes an interlayer dielectric (e.g., silicon dioxide) disposed between the second side of the semiconductor substrate and the intermetal dielectric stack.

In one or more embodiments, the intermetal dielectric stack includes one or more layers of a dielectric material (e.g., silicon dioxide) and one or more metal layers (e.g., separated by the one or more layers of the dielectric material). The one or more metal layers may be electrically interconnected through one or more vias (e.g., formed of the same type of metal as the one or more metal layers or otherwise) to provide an electrical connection to one or more components of the semiconductor device. In some embodiments, the interlayer dielectric encapsulates one or more components (e.g., source electrodes, drain electrodes, gate electrodes, or otherwise) formed on the second side of the semiconductor substrate and the one or more vias that electrically coupled the one or more components to the metal layers.

In some embodiments, the one or more metal layers and one or more vias may be formed of aluminum, copper, tungsten, gold, any other sufficiently conductive material to allow for electrical coupling to the one or more components of the semiconductor device, or combinations thereof. In the same or other embodiments, the intermetal dielectric stack includes a first metal interconnect included in the one or more metal layers. In one embodiment, the first metal interconnect corresponds to a metal 1 layer that is closer to the second side of the semiconductor substrate than any other one of the one or more metal layers. In the same or other embodiments, the first metal interconnect includes at least a first terminal coupled to at least one of the one or more components of the semiconductor device and a second terminal to provide an electrical coupling to the at least one of the one or more components via a contact pad (see, e.g., FIG. 1I and FIG. 4).

Block 110 illustrates depositing an etch stop layer on the semiconductor substrate such that the first side of the semiconductor substrate is disposed between the etch stop layer and the STI structure. In some embodiments the etch stop layer corresponds to or otherwise includes a high-κ dielectric material (e.g., a material with a dielectric constant greater than silicon dioxide such as aluminum oxide, silicon carbide, or the like) that may be deposited by chemical vapor deposition (CVD), atomic layer deposition (ALD), physical vapor deposition (PVD), sol-gel processing, or the like. In the same or other embodiments, the etch stop layer may have a deposition thickness of approximately 5 nm to 30 nm. The etch stop layer may have high etching selectivity to subsequent deposit material such as silicon nitride and metal material to provide protection to the underlying semiconductor substrate or wafer during subsequent steps of the process 100-A. In some embodiments, the etch stop layer may be structured to have one or more openings to allow etching through the one or more openings. In other embodiments, the etch stop layer may be deposited or otherwise formed as a continuous film on top of the semiconductor substrate.

Block 115 shows etching a first trench into the semiconductor substrate during a first etching step. More specifically, standard photolithographic techniques may be utilized to overlap the etch stop layer with a pattern of a photoresist layer (e.g., light sensitive polymeric material) for forming at least the first trench. In some embodiments, the pattern of the photoresist layer may be formed by using a photomask (e.g., via a reticule disposed proximate to the etch stop layer and covering, at least in part, the semiconductor device or wafer) to selectively develop (e.g., polymerize, decompose, cross-link, or the like) portions of the photoresist layer such that the pattern is structured to allow selective etching through the first side of the semiconductor substrate towards the STI structure. Once the pattern of the photoresist has been formed on the etch stop layer, etching (e.g., reactive-ion etching) may be utilized to form at least the first trench that extends from the etch stop layer, past the first side of the semiconductor substrate, and to the STI structure. In some embodiments the first trench extends to a surface of the STI structure. In the same or other embodiments, the first etching step partially etches the STI structure such that the first trench extends beyond an interface defined by where the semiconductor substrate or wafer interfaces with the STI structure. In one or more embodiments, an etch depth of the first etching step (i.e., a total depth of the first trench) may be between 5 μm to 10 μm depending on at least a thickness of the semiconductor substrate or wafer. In the same or other embodiments, a width of the first trench may be on the order of tens of microns.

Block 120 illustrates depositing a dielectric material (e.g., silicon nitride) into at least the first trench during a dielectric deposition step to form a dielectric spacer extending along side walls of the first trench. More specifically, the dielectric material may conformally coat the etch stop layer, the side walls of the first trench, and an exposed region of the STI structure. Thus, in some embodiments, the etch stop layer is disposed between the dielectric material and the first side of the semiconductor. Additionally, in the same or other embodiments, the STI structure is disposed between the dielectric material and the second side of the semiconductor substrate. In some embodiments, a thickness $T_D$ of the dielectric material deposited during the dielectric deposition step is approximately 50 nm to 500 nm. It is further appreciated that in some embodiments, the dielectric material does not completely fill the first trench. Rather, the conformal coating of the dielectric material on the side walls of the first trench results in a narrowed opening of the first trench relative to before the dielectric deposition step. Advantageously, the conformal coating of the dielectric material may be utilized in subsequent steps of process 100-A as a mask (e.g., in place of a more expensive photomask or reticule) to form one or more contact pads in a bonding pad region of the semiconductor device or wafer, one or more contact pads in a scribe line region of the semiconductor wafer (e.g., for testing the semiconductor device in advance of wafer dicing), or the like.

Block 125 shows anisotropically etching (e.g., via reactive ion etching) the dielectric material during an anisotropic etch stop after the dielectric deposition step. In some embodiments, the anisotropic etch step results in the removal of the dielectric material that conformally coats the etch stop layer and the exposed region of the STI structure while leaving the portion of the dielectric material coating the side walls of the first trench to form the dielectric spacer. As discussed above, the dielectric spacer may be utilized as a mask in subsequent steps of process 100-A.

Block 130 illustrates etching a second trench aligned with the first trench during a second etching step based, at least in part, on the dielectric spacer. In other words, the dielectric spacer, in combination with the etch stop layer, acts as a mask to allow for further etching through the narrowed opening of the first trench without the use of an additional photomask or reticule. In some embodiments, the second etching step results in etching through the exposed portion of the STI structure until reaching the first metal interconnect included in the one or more metal layers of the intermetal dielectric stack. In other words, the second trench is a continuation of the narrowed first trench that extends through the exposed portion of the STI structure and the second side of the semiconductor substrate until reaching the first metal interconnect. In some embodiments, the trench width or opening width of the second trench is defined based on the deposited thickness of the dielectric spacer. In some embodiment, the separation between STI structure and the first metal interconnect is at least 100 nm, and the extended depth of the second trench is greater than 100 nm. In some embodiments, the first metal interconnect may act as a secondary etch stop by having a lower etch rate relative to the etch rates of STI structure and the underlying dielectric between the STI structure and the first metal interconnect.

Block 135 shows depositing a metal material (e.g., aluminum, copper, tungsten, gold, any other sufficiently conductive material to allow for electrical coupling to the one or more components of the semiconductor device) into the second trench during a metal deposition step to form a contact pad of the semiconductor device. It is appreciated that an additional photomask may not be necessary for the metal deposition step, which results in the metal material coating the etch stop layer, filling the first trench, and filling the second trench such that the metal material is electrically coupled to the first metal interconnect. In some embodiments, the metal material directly contacts the first metal interconnect. However, in other embodiments, the metal material indirectly contacts the first metal interconnect as there may be one or more intermediary metals or other electrically conductive materials disposed between the metal material and the first metal interconnect. In some embodiments, the metal material is separated and electrically isolated from the semiconductor material by the dielectric spacer that surrounded the metal material.

Block 140 illustrates etching the metal material during a metal etch step to remove excess portions of the metal material contacting the etch stop layer and to further remove a portion of the metal material laterally surrounded by the dielectric spacer to form the contact pad. It is appreciated that the metal etch step may include multiple substeps. For example, in one embodiment, chemical mechanical polishing (CMP) is utilized to remove the portions of the metal material coating the etch stop layer. After CMP, the portion of the metal material laterally surrounded by the dielectric spacer may be etched (e.g., to thin down the thickness of the deposited metal material in the first trench) or otherwise removed to form the contact pad while maintaining a sufficient thickness of the contact pad for reliable electrical connection. In some embodiments, the width of the contact pad overlaps at least 10% of the contacted first metal interconnect. In some embodiments the thickness of the deposited metal material for contact pad is sufficient to have enough support for a wire-bonding process (e.g., a subsequently formed wire-bond structure that does not penetrate through the formed contact pad). In some embodiments, the metal material is etched such that the contact pad extends from the first metal interconnect, through the second side of the semiconductor substrate, and through the STI structure until terminating between the first side of the semiconductor substrate and the STI structure. In some embodiments, an end of an external wire (e.g., corresponding to a wire-bond connection) is disposed inside first trench and attached or otherwise in both physical and electrical contact with an upper or exposed surface of the contact pad for forming an external connection. In some embodiments, once the contact pad is formed, the etch stop layer is removed, for example by another dry etching process, to allow for further processing of the semiconductor substrate or wafer (e.g., dicing the semiconductor wafer and packaging individual dies formed from the semiconductor wafer).

FIGS. 1B-1I illustrate example cross-sectional views of an image sensor corresponding to various blocks included in the process 100-A of FIG. 1A when the semiconductor device is an example image sensor, in accordance with the teachings of the present disclosure. More specifically, the image sensor illustrated in FIGS. 1B-1I shows for the simultaneous formation of contact pads (see, e.g., contact pad 167 and contact pad 169 illustrated in FIG. 1I disposed respectively within a bonding pad (BPAD) region 106 and a backside scribe line (BSL) region 108) of the image sensor during the BEOL processing stage in accordance with the process 100-A of FIG. 1A. As illustrated in FIGS. 1B-1I, the image sensor is divided into various segments including, but not limited to, pixel region 102, peripheral region 104, bonding pad (BPAD) region 106, and backside scribe line (BSL) region 108. The pixel region 102 corresponds to where one or more image pixels, their corresponding circuitry (e.g., components included in 4T, 5T, 6T, or other circuitry for controlling, reading out, or otherwise manipulating the one or more image pixels), and one or more optical components for the one or more pixels (e.g., any one of, or a combination of, color filters, microlenses, metal grid, attenuation layer, and the like). The peripheral region 104 surrounds the pixel region 104. Similarly, the BPAD region 106 surrounds the peripheral region 104 and provides an area for the formation of one or more contact pads 167. In embodiments, the one or more contact pads 167 in the BPAD region 106 is coupled to the one or more image pixels in a pixel array in the pixel region 102. Finally, the BSL region 108 surrounds the BPAD region 106 and provides an area for the formation of one or more contact pads 169 in the BSL region 108. The one or more contact pads 169 within the BSL region 108 may enable wafer-level testing of a given semiconductor device for determining parameters associated with the given semiconductor device including, but not limited to, any one of sheet resistance, current-voltage (I-V) testing, capacitor-voltage (C-V) testing, wafer thickness measurement, signal connection testing, bloom testing, or combinations thereof. It is further appreciated that the one or more contact pads 169 in the BSL region 108 may define or otherwise be proximate to the perimeter of a given semiconductor device and may function as an indicator of where to dice or otherwise cut the semiconductor wafer to form a plurality of dies that each correspond to an instance of the semiconductor device. In some embodiments, the structure associated with the one or more contact pads 169 included in the BSL region 108 may provide protection to the semiconductor device (e.g., prevent or reduce particle generation during wafer dicing).

During the process 100-A of FIG. 1A and as illustrated in FIGS. 1B-1I, the image sensor includes a semiconductor substrate 101 having a first side 113 (e.g., a backside) and a second side 111 (e.g., a front side), a dielectric stack 117 (e.g., one or more layers of silicon dioxide, hafnium dioxide, tantalum pentoxide, or the like) disposed proximate to the first side 113 for passivation and anti-reflection, an intermetal dielectric stack 119 disposed proximate to the second side 111, and a metal grid 132 formed within a dielectric or planarization layer 121. In some embodiments, the intermetal dielectric stack 119 may be coupled to a carrier wafer 190 to provide mechanical support to the semiconductor substrate 101 during the BEOL processing stage. As illustrated, the carrier wafer 190 is opposite of an illuminated side 127 of the image sensor. As shown in FIGS. 1B-1I, the semiconductor substrate 101 includes an STI structure 128 disposed between the first side 113 and the second side 111 of the semiconductor substrate 101. The STI structure 128 extends from the second side 111 of the semiconductor substrate 101 a depth toward the first side 113. The STI structure 128 is formed of dielectric material (e.g., silicon dioxide). In the same embodiment, the intermetal dielectric stack 119 includes a dielectric material (e.g., silicon dioxide formed as one or more dielectric layers during metallization) that separate one or more metal layers 134 (e.g., first metal interconnect 134-1). It is appreciated that the one or more metal layers are interconnected by one or more vias 136 to provide an electrical coupling between one or more components of the pixel region 102 and the BPAD region 106. Although not illustrated in FIGS. 1A-1I, the one or more metal layers may be connected to one or more pixel circuitry components (e.g., transistor gate electrode, source electrode, drain electrode, floating diffusion, and the like) disposed proximate to second side 111 of semiconductor substrate through vias (see, e.g., FIG. 4). In the illustrated embodiment, the intermetal dielectric stack 119 further includes a metal interconnect 138 disposed within the BSL region 108 for forming the contact pad 169. In some embodiments the metal interconnect 138 provides an electrical connection for testing the semiconductor device. However, in other embodiments, the metal interconnect 138 is electrically isolated and functions only as an etch stop.

FIG. 1B illustrates an example cross-sectional view of the semiconductor substrate 101 during block 110 of the process 100-A illustrated in FIG. 1A when the semiconductor device is the image sensor, in accordance with the teachings of the present disclosure. As illustrated, an etch stop layer 150 is deposited proximate to the illuminated side 127 of the image sensor and overlaid with a pattern 199 of photoresist using a photomask for forming one or more trenches (e.g., a first trench 151 in the BPAD region 106 and a first scribe line trench 181 in the BSL region 108 illustrated in FIG. 1C). In the illustrated embodiment, the etch stop layer 150 substantially covers the illuminated side 127 of the image sensor and extends from the pixel region 102 to the BSL region 108.

Figure 1C:
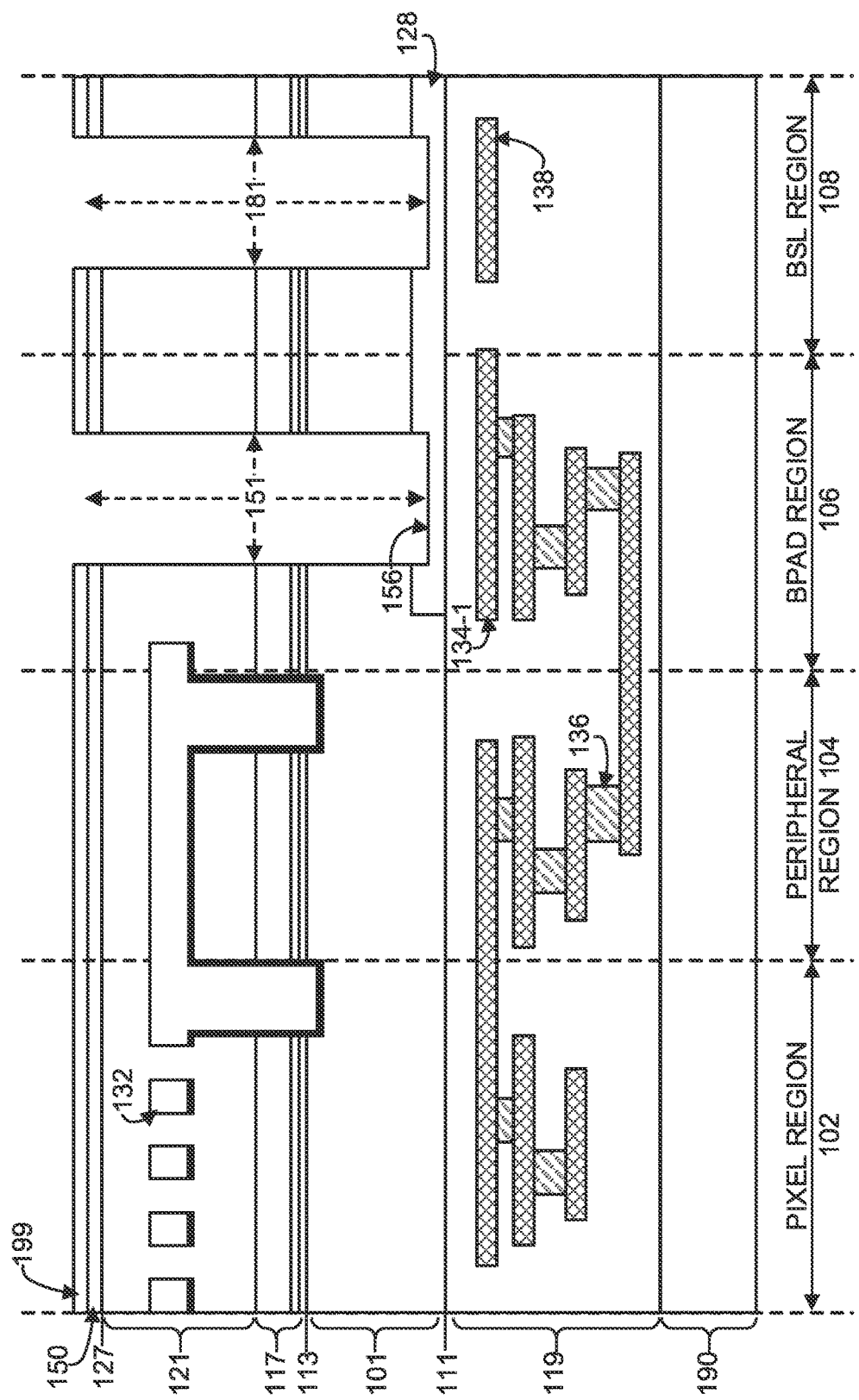

FIG. 1C shows an example cross-sectional view of the semiconductor substrate 101 during block 115 of the process 100-A illustrated in FIG. 1A when the semiconductor device is the image sensor, in accordance with the teachings of the present disclosure. As illustrated, the first trench 151 within the BPAD region 106 and the first scribe line trench 181 in the BSL region 108 have been formed by etching material underlying openings of the pattern 199 from the illuminated side 127 of the image sensor through the first side of the semiconductor substrate 101 until reaching the STI structure 128, which exposes a surface of the STI structure 128 (e.g., exposed region 156 of the STI structure 128). It is appreciated that the first scribe line trench 181 is not necessarily a trench for forming a scribe line, but rather corresponds to a trench formed within the BSL region 108 (e.g., for forming contact pad 169 that is electrically coupled to metal interconnect 138 as illustrated in FIG. 1I). In many embodiments, the first scribe line trench 181 is substantially similar to the first trench 151 other than being disposed within the BSL region 108. In some embodiments, the pattern 199 of photoresist will be removed after the formation of the first trench 151 and the first scribe line trench 181. In the illustrated embodiment, the first trench 151 is disposed within the BPAD region 106 and the first scribe line trench 181 is disposed within the BSL region 108 for respectively forming the contact pad 167 and the contact pad 169 illustrated in FIG. 1I.

Figure 1D:
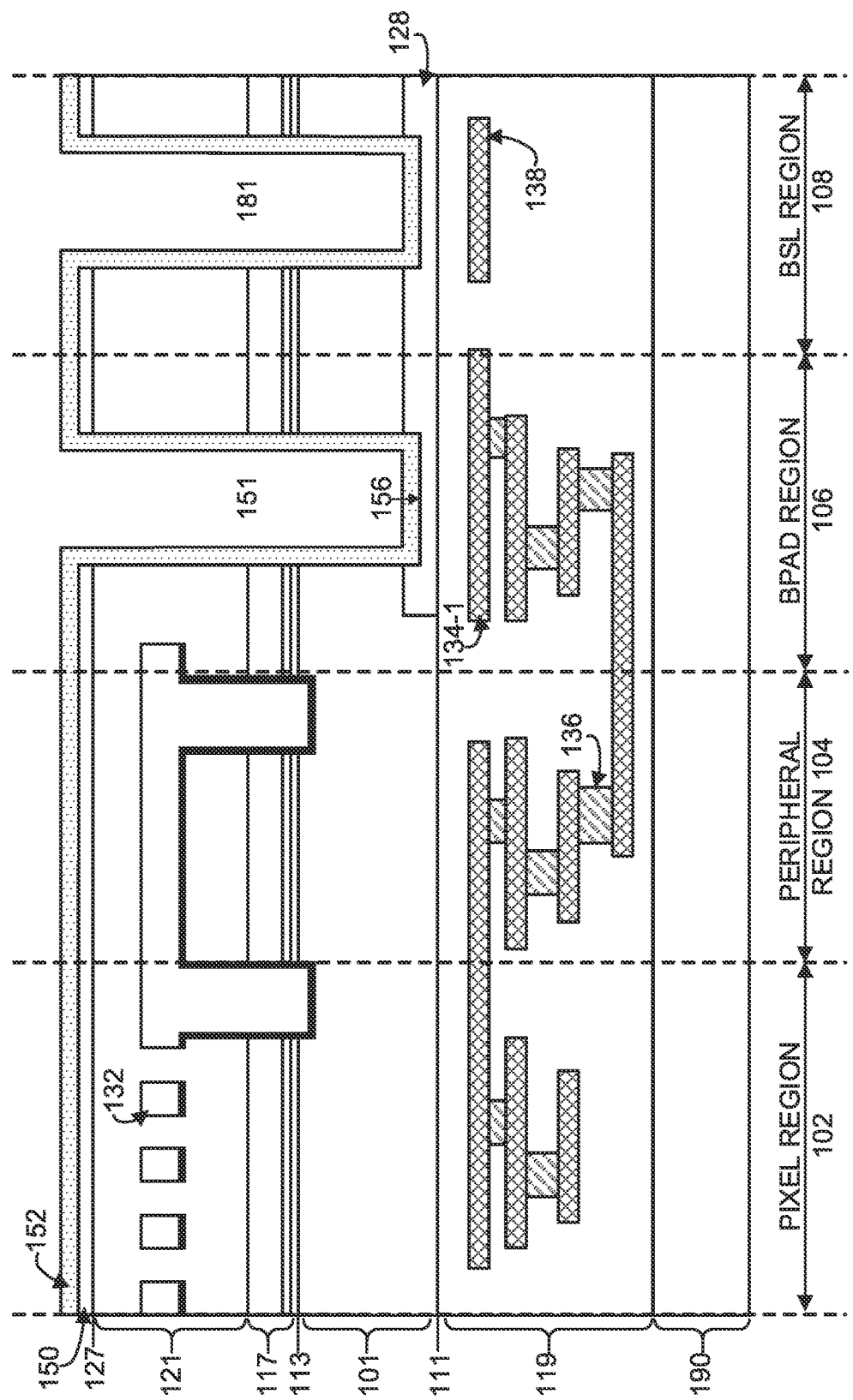

FIG. 1D illustrates an example cross-sectional view of the semiconductor substrate 101 during block 120 of the process 100-A illustrated in FIG. 1A when the semiconductor device is the image sensor, in accordance with the teachings of the present disclosure. More specifically, FIG. 1D illustrates depositing a dielectric material 152 into the first trench 151 and the first scribe line trench 181 during a dielectric deposition step to form a dielectric spacer 154 (see, e.g., FIG. 1E). Referring back to FIG. 1D, the dielectric material 152 conformally coats the side walls of the first trench 151, the side walls of the first scribe line trench 181, the exposed region 156 of the STI structure 128, and the etch stop layer 150. Additionally, it is noted that the illuminated side 127 of the image sensor remains protected as the etch stop layer 150 is disposed between the dielectric material 152 and the first side 113 of the semiconductor substrate 101. In embodiments, the dielectric material 152 and STI structure 128 collectively provide electrical isolation between the semiconductor substrate 101 and subsequently deposited metal material.

Figure 1E:
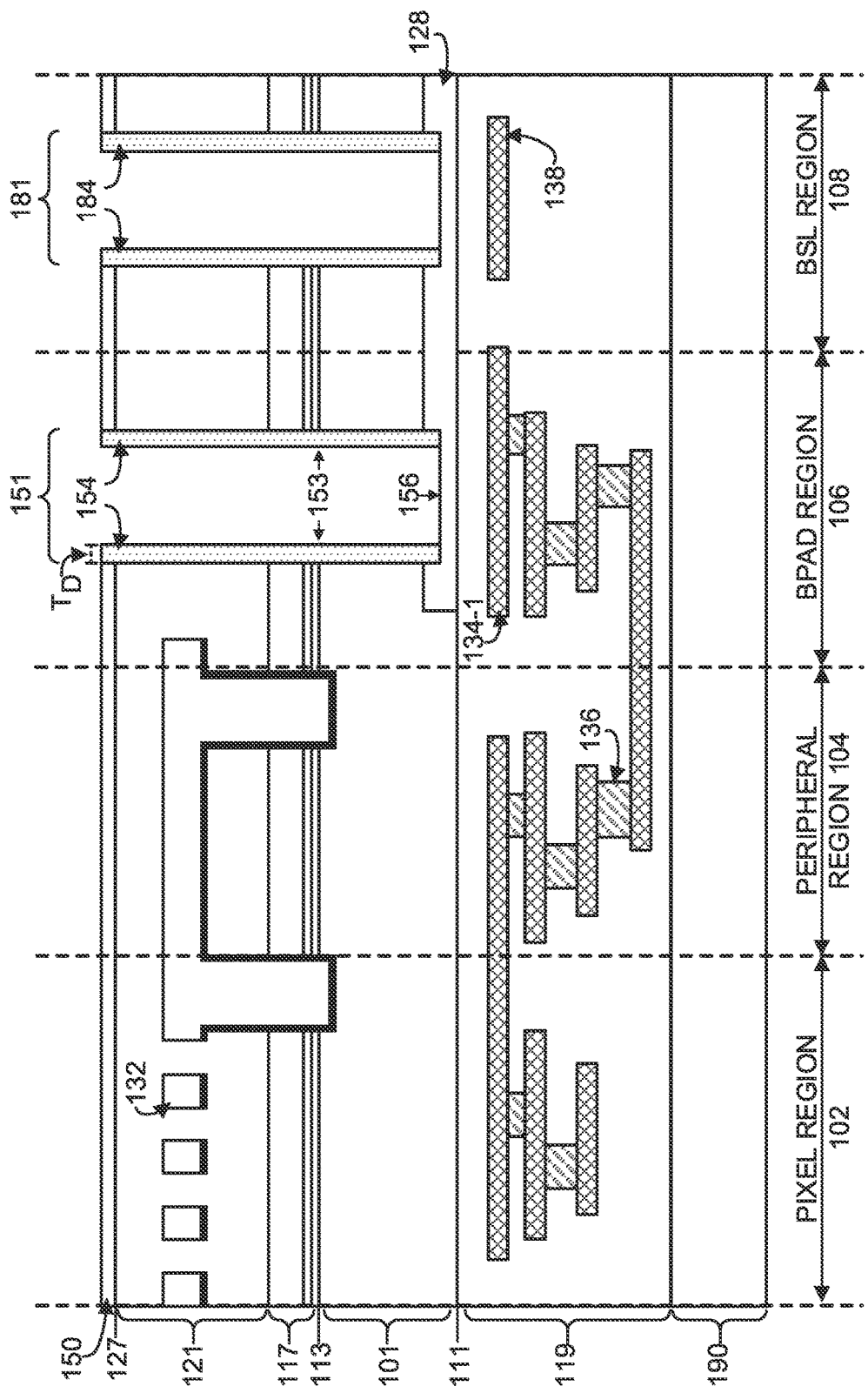

FIG. 1E shows an example cross-sectional view of the semiconductor substrate 101 during block 125 of the process 100-A illustrated in FIG. 1A when the semiconductor device is the image sensor, in accordance with the teachings of the present disclosure. As illustrated, the dielectric material 152 is anisotropically etched during an anisotropic etch step after the dielectric deposition step to remove the dielectric material 152 coating the etch stop layer 150 and exposed regions 156 of the STI structure 128 to form dielectric spacers 154 and 184. In some embodiments, the dielectric spacers 154 and 184 extend continuously from the illuminated side 127 of the image sensor to the STI structure 128. It is appreciated that the dielectric spacer 154 defines a narrowed opening 153 of the first trench 151 based on a thickness $T_D$ of the dielectric spacer 154, which will function as a mask for forming the contact pad 167 without the use of a traditional photomask or reticule.

Figure 1F:
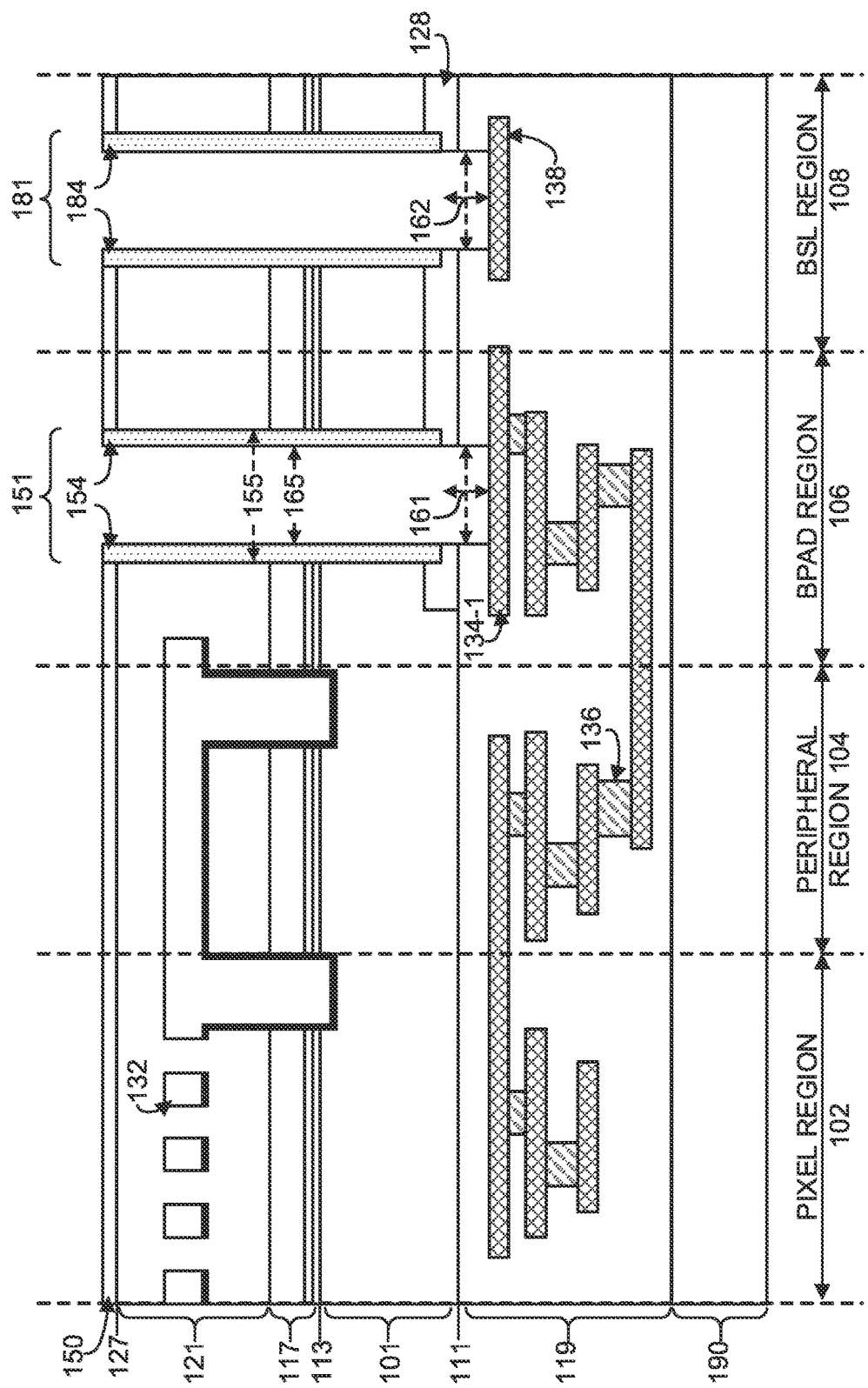

FIG. 1F illustrates an example cross-sectional view of the semiconductor substrate 101 during block 130 of the process 100-A illustrated in FIG. 1A when the semiconductor device is the image sensor, in accordance with the teachings of the present disclosure. More specifically, FIG. 1F illustrates a second etching step that utilizes the dielectric spacer 154, the dielectric spacer 184, and the etch stop layer 150 as a mask (e.g., without using any additional photomasks) to form a second trench 161 that is self-aligned with the first trench 151 and a second scribe line trench 162 that is self-aligned with the first scribe line trench 181. As noted above, it is appreciated that the second scribe line trench 162 is not necessarily a trench for forming a scribe line, but rather indicates that the second scribe line trench 162 is disposed within the BSL region 108 and may be destroyed, damaged, or otherwise removed during wafer dicing. It is further appreciated that the second trench 161 and the second scribe line trench 162 respectively correspond to a continued etching step based on the narrowed opening formed by the dielectric spacers 154 and 184. As illustrated, the second trench 161 extends through the STI structure 128 to the first metal interconnect 134-1. Similarly, the second scribe line trench 162 extends through the STI structure 128 to the metal interconnect 138. In other words, the second etching step exposes the first metal interconnect 134-1 and the metal interconnect 138 to allow for direct contact thereof for respectively forming the contact pad 167 and the contact pad 169 illustrated in FIG. 1I. Referring back to FIG. 1F, a first width 155 of the first trench 151 is greater than a second width 165 of the second trench 161. In some embodiments, the second width 165 is based on a difference between the first width 155 of the first trench 151 and two times the thickness $T_D$ of the dielectric spacer 154. Similarly, in some embodiments, a trench width of the first scribe line trench 181 is greater than a trench width of the second scribe line trench 162 with a difference based on the trench width of the first scribe line trench 181 and the deposited thickness of the dielectric spacer 184.

Figure 1G:
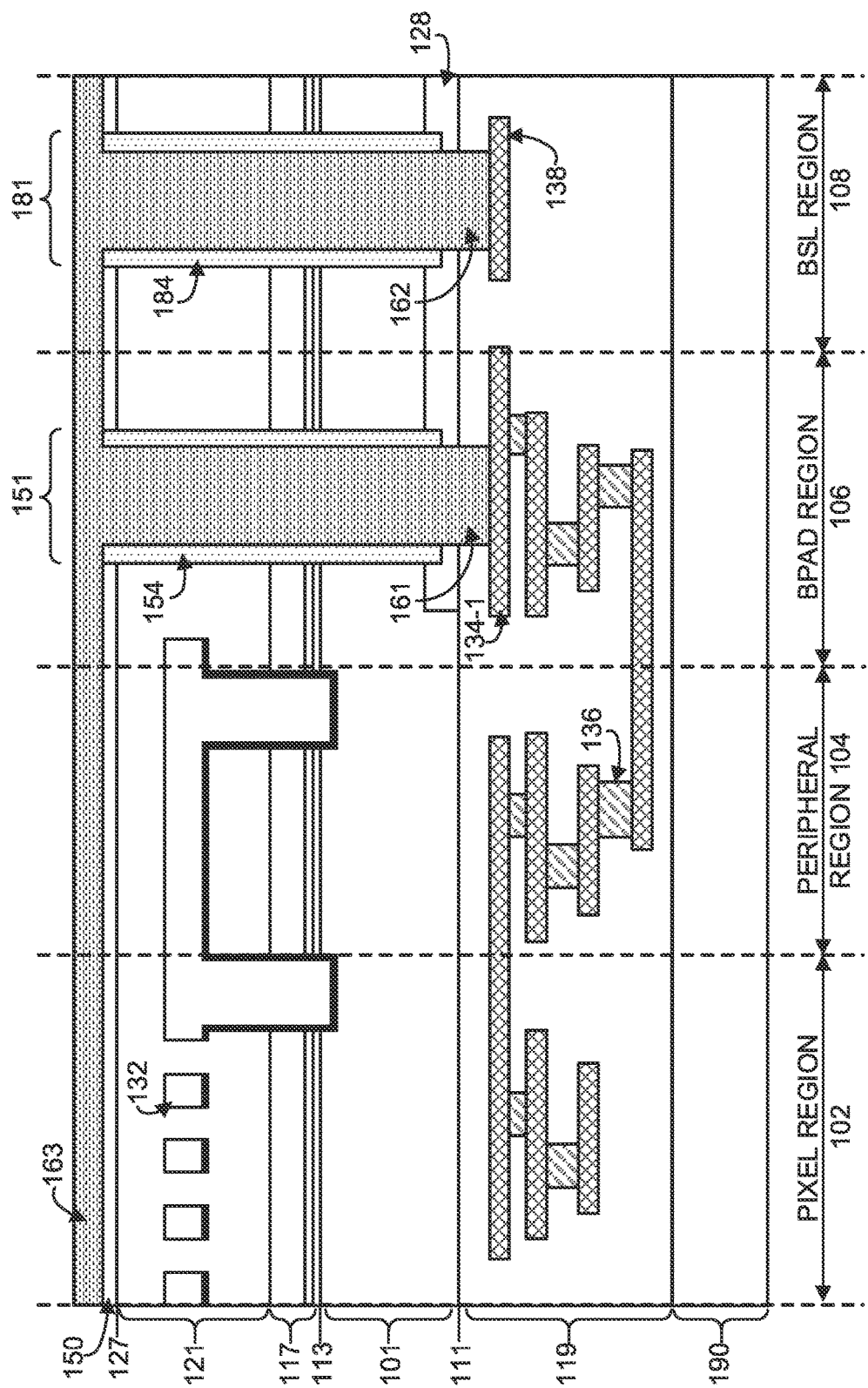

FIG. 1G shows an example cross-sectional view of the semiconductor substrate 101 during block 135 of the process 100-A illustrated in FIG. 1A when the semiconductor device is the image sensor, in accordance with the teachings of the present disclosure. FIG. 1G illustrates depositing a metal material 163 (e.g., aluminum, copper, tungsten, gold, any other sufficiently conductive material to allow for electrical coupling to the one or more components of the image sensor) during a metal deposition step to form the contact pad 167 within the BPAD region 106 and the contact pad 169 within the BSL region 108. As illustrated, the metal material 163 at least partially fills the first trench 151, the second trench 161, the first scribe line trench 181, and the second scribe line trench 162 such that the metal material 163 is laterally surrounded by the dielectric spacers 154 and 184. Additionally, the metal material 163 further extends over the etch stop layer 150 such that the etch stop layer 150 is disposed between the metal material 163 and the first side 113 of the semiconductor substrate 101.

Figure 1H:
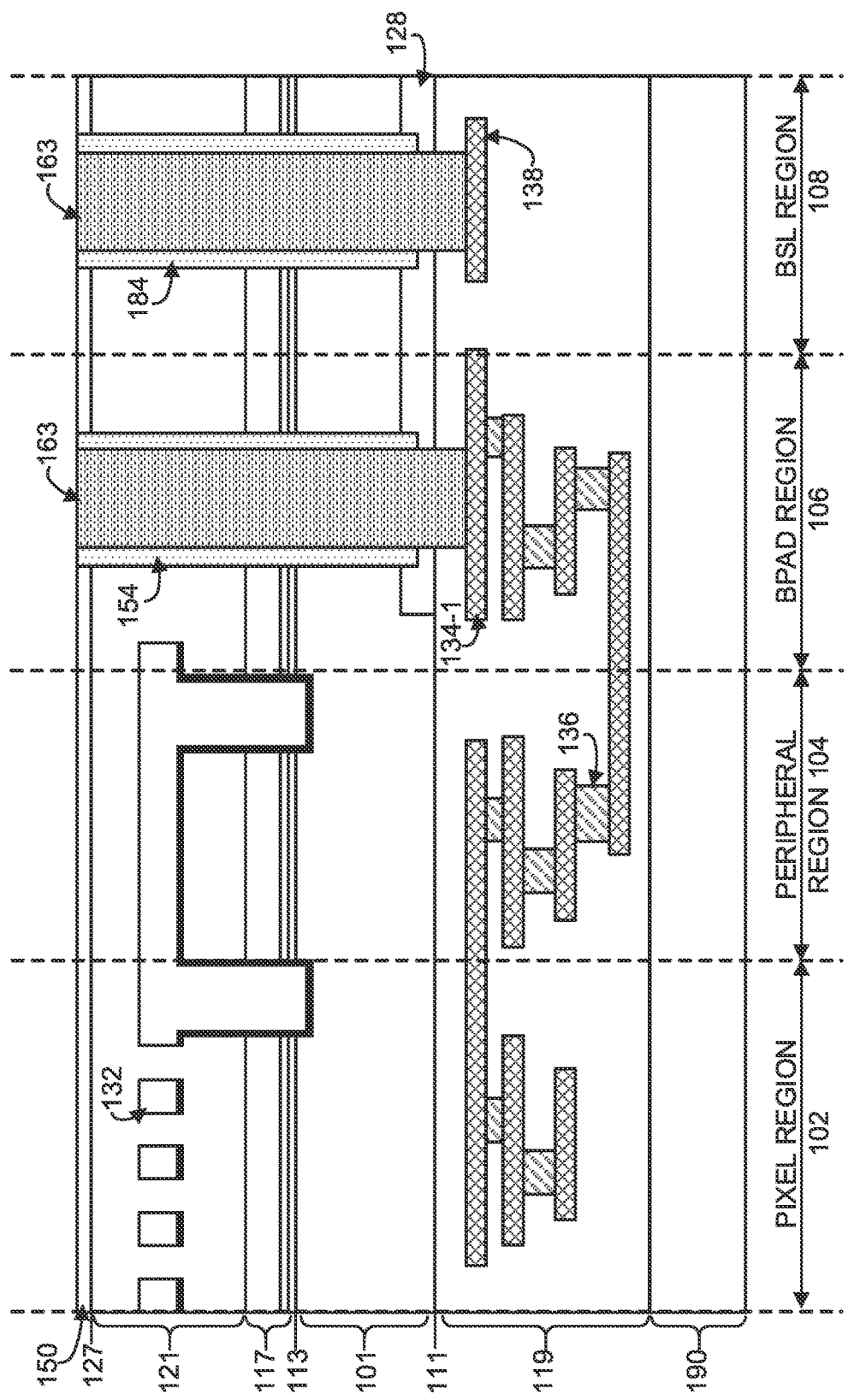
Figure 1I:
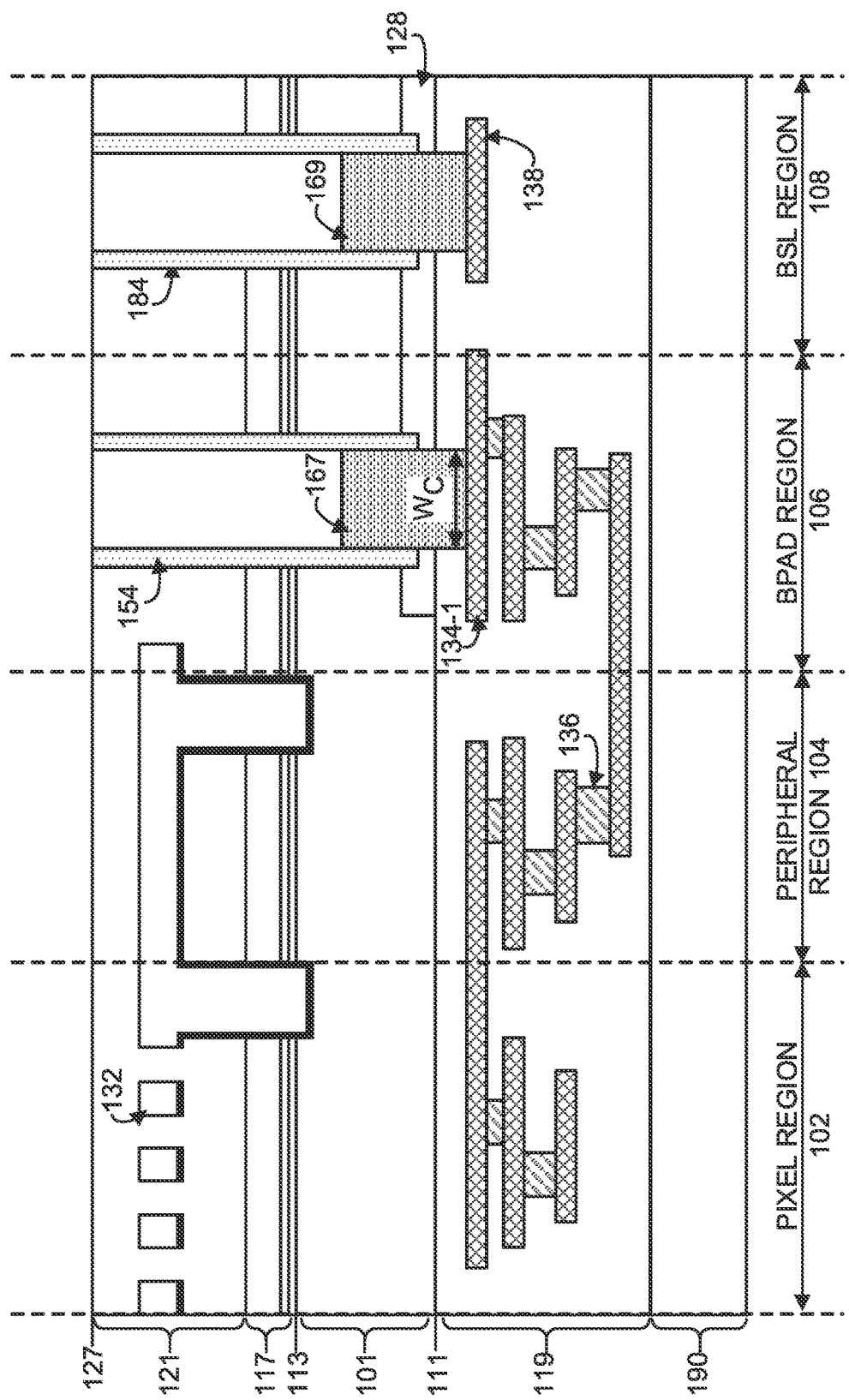

FIGS. 1H and 1I illustrate example cross-sectional views of the semiconductor substrate 101 during block 140 of the process 100-A illustrated in FIG. 1A when the semiconductor device is the image sensor, in accordance with the teachings of the present disclosure. More specifically, FIG. 1H illustrates etching the metal material 163 (e.g., via chemical mechanical polishing) during a metal etch step to remove excess portions of the metal material 163 contacting the etch stop layer 152 while FIG. 1I illustrates etching the metal material 163 during the metal etch step to further remove a portion of the metal material 163 laterally surrounded by the dielectric spacers 154 and 184 for respectively forming the contact pad 167 and the contact pad 169. It is appreciated that in some embodiments, the metal etch step shown by FIGS. 1H and 1I may be performed without any additional photomasks. After the contact pad 167 and the contact pad 169 are formed, the etch stop layer 152 is further removed, for example by a dry plasma etching process. In the illustrated embodiment of FIG. 1I, the contact pad 167 is completely contained within the first trench 151 and the second trench 161 that were formed during the first and second etching steps. Similarly, the contact pad 169 is completely contained within the first scribe line trench 181 and the second scribe line trench 162 that were formed during the first and second etching steps. In other words, in one embodiment, the contact pad 167 and the contact pad 169 do not extend beyond a plane defined by the first side 113 of the semiconductor substrate 101. In the illustrated embodiment of FIG. 1I, the contact pads 167 and 169 are electrically isolated from the semiconductor substrate 101 by dielectric spacers 154, 184 and the STI structure 128. In the same or other embodiments, the contact pad 167 has a contact width $W_C$ with the first metal interconnect 134-1, and the contact width $W_C$ is at least 10% of a width of the contacted first metal interconnect 134-1.

FIGS. 2A-2D illustrate an example process for manufacturing a contact pad of an image sensor, in accordance with the teachings of the present disclosure. The example process shown by FIGS. 2A-2D is one possible implementation or addition to the process 100-A illustrated in FIG. 1A. Additionally, it is noted that the FIGS. 2A-2D illustrate cross sectional views of an image sensor corresponding to the semiconductor device similar to that of the image sensor shown in FIGS. 1B-1I with like-labeled elements.

Figure 2A:
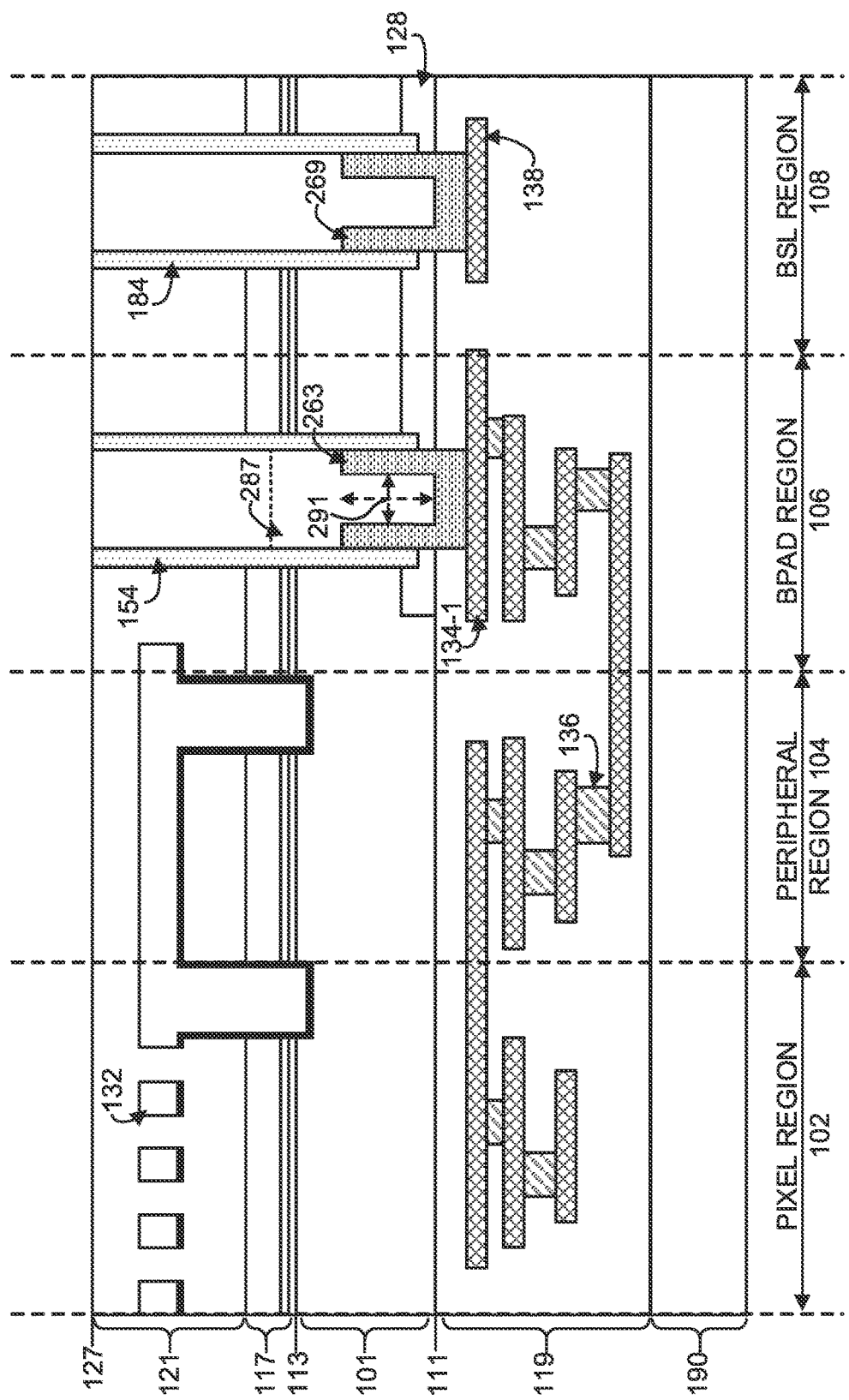
FIGS. 2A-2D illustrate an example process for manufacturing a contact pad of an image sensor, in accordance with the teachings of the present disclosure.

FIG. 2A illustrates a variation of the process 100-A illustrated in FIG. 1A in which during block 130 a metal material 263 conformally coats the dielectric spacer 154 through material deposition process e.g., chemical vapor deposition, to form a third trench 291 disposed between metal side walls of the metal material 263. In one embodiment, excess portions of the metal material 263 may be etched to form the corresponding contact pad (e.g., metal material 263 having a U-shape as illustrated in FIG. 2A) and the contact pad 269. In one embodiment, a self-aligned deposition process of metal material 263 can be controlled to conformally coat the dielectric spacer 154 and the extended second trench (e.g., second trench 161). In some embodiments, an optional secondary metal material 287 (e.g., aluminum, copper, tungsten, gold, aluminum alloy, any other sufficiently conductive material to allow for electrical coupling to the one or more components of the semiconductor device, or combinations thereof) may be deposited within the third trench 291 to finalize formation of the contact pad. In some embodiments, the optional secondary metal material (e.g., aluminum alloy such as an aluminum copper alloy) may be deposited into third trench 291 to form a capping layer conformally coating the metal material 263 to form a contact pad with enhanced adhesion (e.g., wiring bonding strength) to a wire being bonded to the contact pad. In the same or other embodiments, the secondary metal material 287 may be a same or a different metal than that of metal material 263. In such embodiments, the secondary metal material 287 is surrounded by the metal material 263 such that the metal material 263 is disposed between the dielectric spacer 154 and the secondary metal material 287. It is appreciated that the structure of metal material 263 illustrated in FIG. 2A may be sufficient as a contact pad in some embodiments as discussed above. However, in other embodiments, it may be desired to not have the metal material 263 directly contact the side walls of the dielectric spacer 154.

Figure 2B:
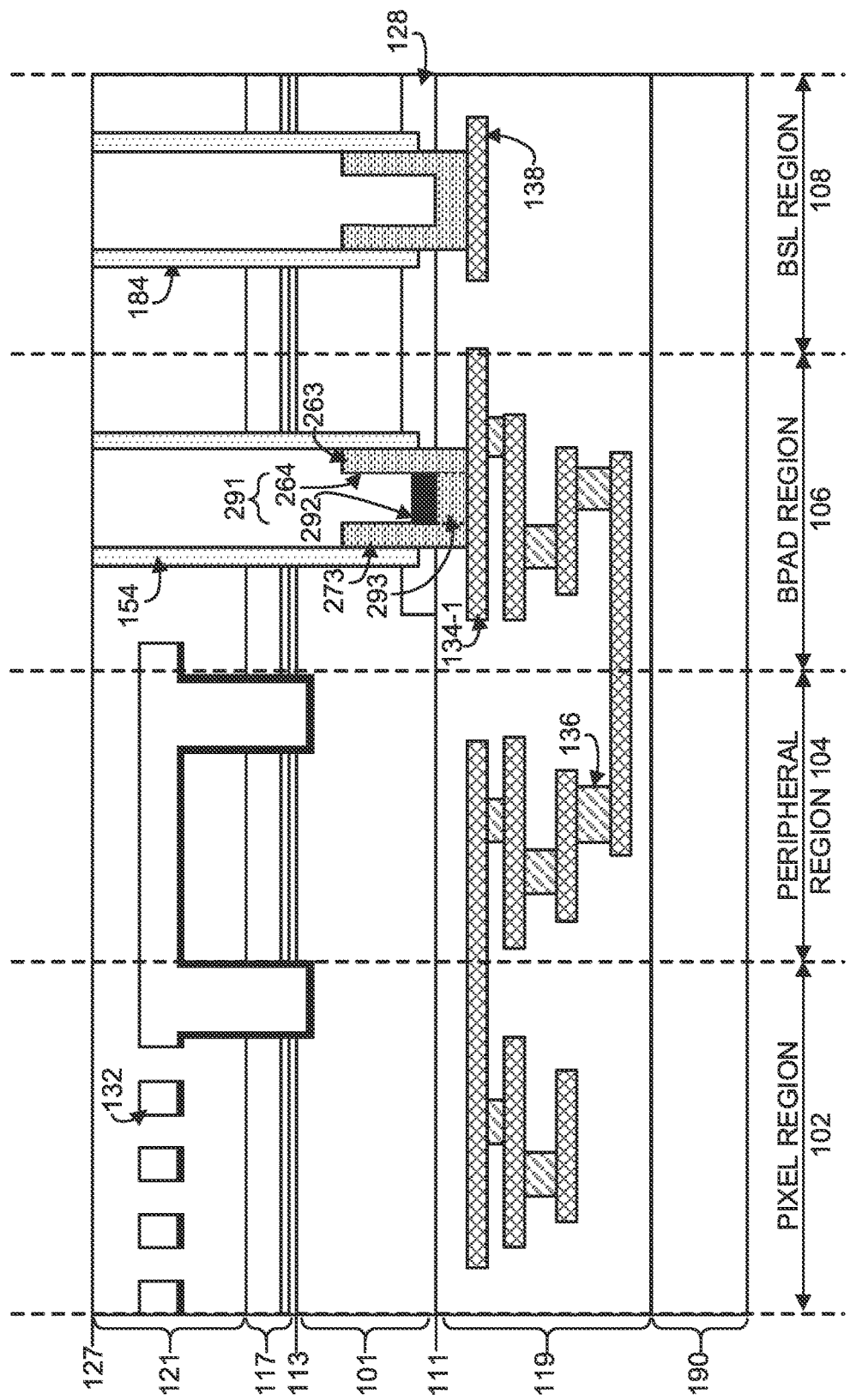

FIG. 2B shows depositing a second etch stop layer 292 (e.g., an organic planarization layer) into the third trench 291 such that the second etch stop layer 292 is disposed between the metal side walls 264 of the metal material 263, in accordance with the teachings of the present disclosure. In other words, the second etch stop layer 292 is laterally surrounded by the metal side walls 264 of the metal material 263. As illustrated, the metal material 263 includes a first segment 293 disposed between the second etch stop layer 292 and the first metal interconnect 134-1. The metal material 263 further includes other segments 273 (e.g., inclusive of the metal side walls 264) not disposed between the second etch stop layer 292 and the first metal interconnect 134-1. As illustrated, the other segments 273 of the metal material 263 form the metal side walls 264 directly contact the dielectric spacer 154.

Figure 2C:
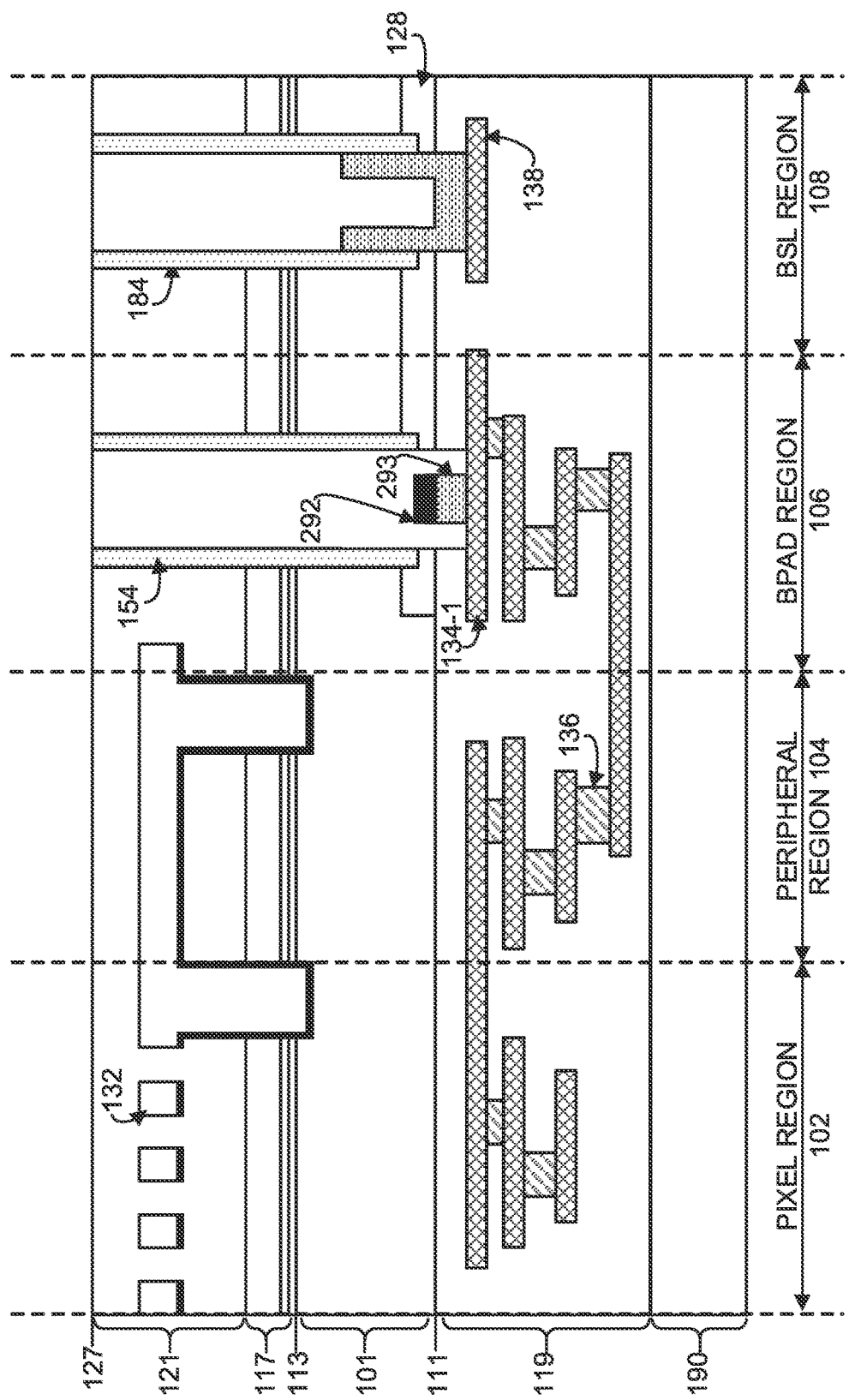
Figure 2D:
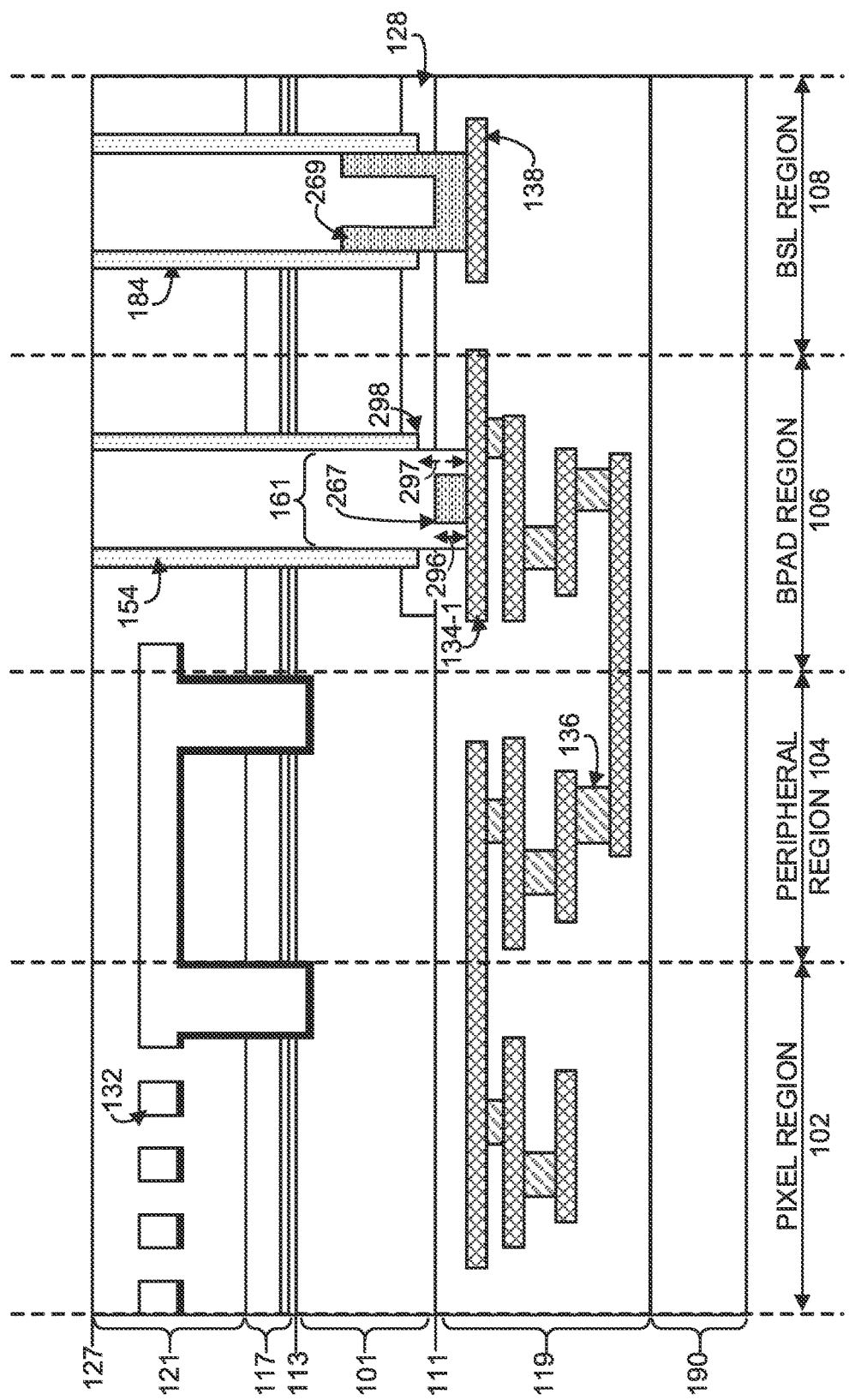

FIG. 2C illustrates etching the other segments 273 of the metal material 263 to form the contact pad 267 illustrated in FIG. 2D, in accordance with the teachings of the present disclosure. Referring back to FIG. 2C, the first segment 293 of the metal material 263 turns into the contact pad 267 when the other segments 273 are etched using the second etch stop layer 292 as a mask and the second etch stop layer 292 is subsequently removed.

FIG. 2D shows the contact pad 267 after the removal of the other segments 273 of the metal material 263 and the second etch stop layer 292, in accordance with the teachings of the present disclosure. As illustrated, a first height 296 of the contact pad 267 is less than a first depth 297 of the second trench 161. In some embodiments, the first depth 297 of the second trench 161 corresponds to a distance from the first metal interconnect 134-1 to a first interface 298 where the dielectric spacer 154 contacts the STI structure 128. In some embodiments, the first height 296 of the contact pad 267 is at least 100 nm.

Figure 3:
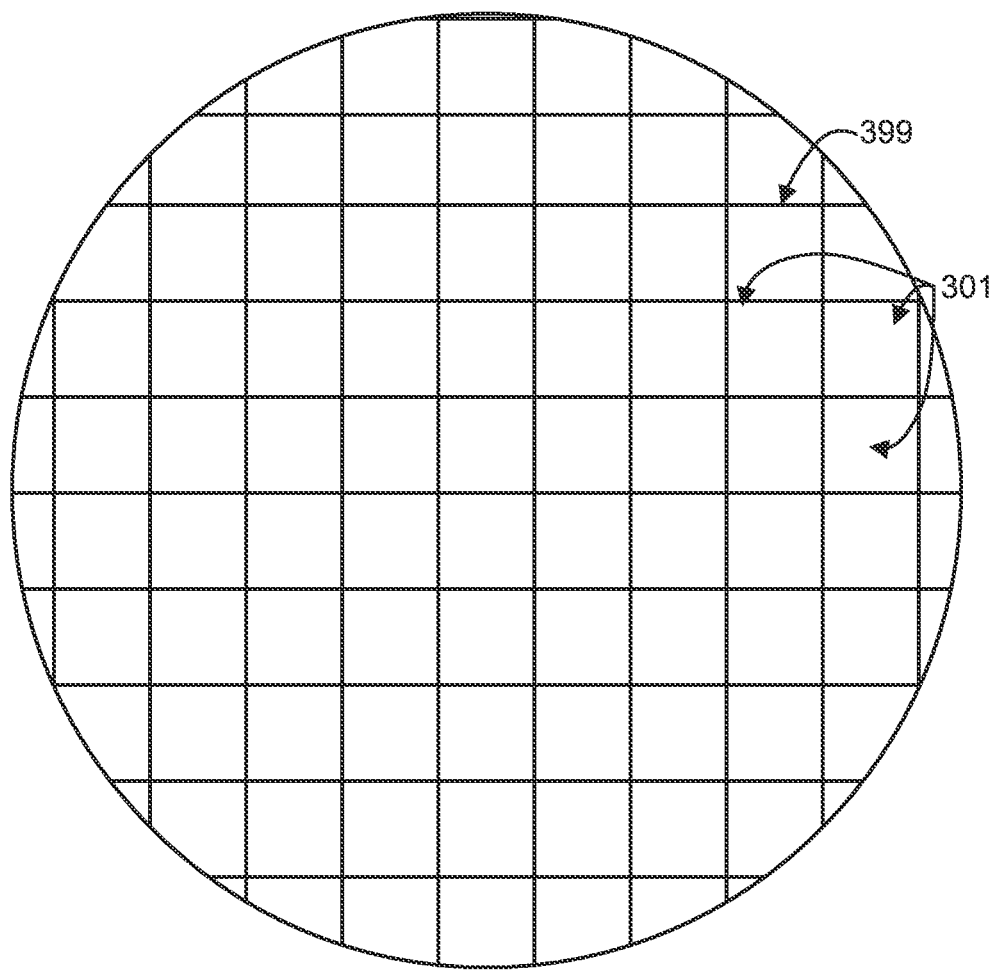
FIG. 3 illustrates a top view of a semiconductor wafer having scribe lines defining individual dies included in a plurality of dies of a semiconductor wafer, in accordance with the teachings of the present disclosure.

FIG. 3 illustrates a top view of a semiconductor wafer 300 having scribe lines 399 defining individual dies included in a plurality of dies 301 of the semiconductor wafer 300, in accordance with the teachings of the present disclosure. More specifically, semiconductor wafer 300 may correspond to one possible implementation of process 100-A illustrated in FIG. 1A. Additionally, or alternatively, semiconductor wafer 300 may correspond to a possible implementation of process 100-A illustrated in FIG. 1A when the semiconductor device is an image sensor as illustrated in FIGS. 1B-1I and/or FIGS. 2A-2D. Accordingly, in some embodiments, each of the plurality of dies 301 may correspond to a respective image sensor with an underlying structure having a cross-sectional view as shown in any of FIGS. 1B-1I and 2A-2D.

In one embodiment, each die included in the plurality of dies 301 corresponds to an instance of a semiconductor device. Each of the plurality of dies are separated from one another by scribe lines 399 that are indicative of where to dice the semiconductor wafer 301. In the same or other embodiment, each instance of the semiconductor device includes a semiconductor substrate corresponding to a portion of the semiconductor wafer 300 defined by the scribe lines 399. It is appreciated that the scribe lines 399 may be disposed within or otherwise define an outer perimeter of a BSL region of the semiconductor device. In accordance with embodiments of the disclosure, each semiconductor device may include an STI structure disposed within the semiconductor substrate 301 between a first side and a second side of the semiconductor substrate 301, an intermetal dielectric stack coupled to the second side of the semiconductor substrate, a dielectric spacer extending from at least the first side of the semiconductor substrate to the STI structure, and a contact pad laterally surrounded by the dielectric spacer. In the same or other embodiments, the intermetal dielectric stack includes a first metal interconnect and the contact pad electrically contacts (e.g., in the form of direct or indirect physical contact) the first metal interconnect for each instance of the semiconductor device. In some embodiments, the dielectric spacer contacts the STI structure to form a first interface. In the same or other embodiments, the contact pad contacts the STI structure and the first interface for each instance of the semiconductor device. In other words, each instance of the semiconductor devices corresponding to individual dies included in the plurality of dies 301 may include the same features and/or structure as disclosed in FIGS. 1B-2D.

In some embodiments, at least one die (e.g., corresponding to an image sensor) included in the plurality of dies 301 of the semiconductor wafer 300 includes a second contact pad (e.g., contact pad 169 illustrated in FIG. 1I or contact pad 269 illustrated in FIGS. 2A-2D) disposed within a backside scribe line region (e.g., BSL region 108 illustrated in FIGS. 1B-1I and FIGS. 2A-2D) of the at least one die. In the same embodiment, the second contact pad is disposed proximate to at least one of the scribe lines 399. Additionally, in the same embodiment, the second contact pad disposed within the backside scribe line region is formed simultaneously with the contact pad (e.g., contact pad 167 of FIG. 1I or contact pad 267 of FIG. 2D) during a first etching step (e.g., block 115 of FIG. 1A), a dielectric deposition step (e.g., block 120 of FIG. 1A), a second etching step (e.g., block 130 of FIG. 1A), and a metal deposition step (e.g., block 135 of FIG. 1A).

Figure 4:
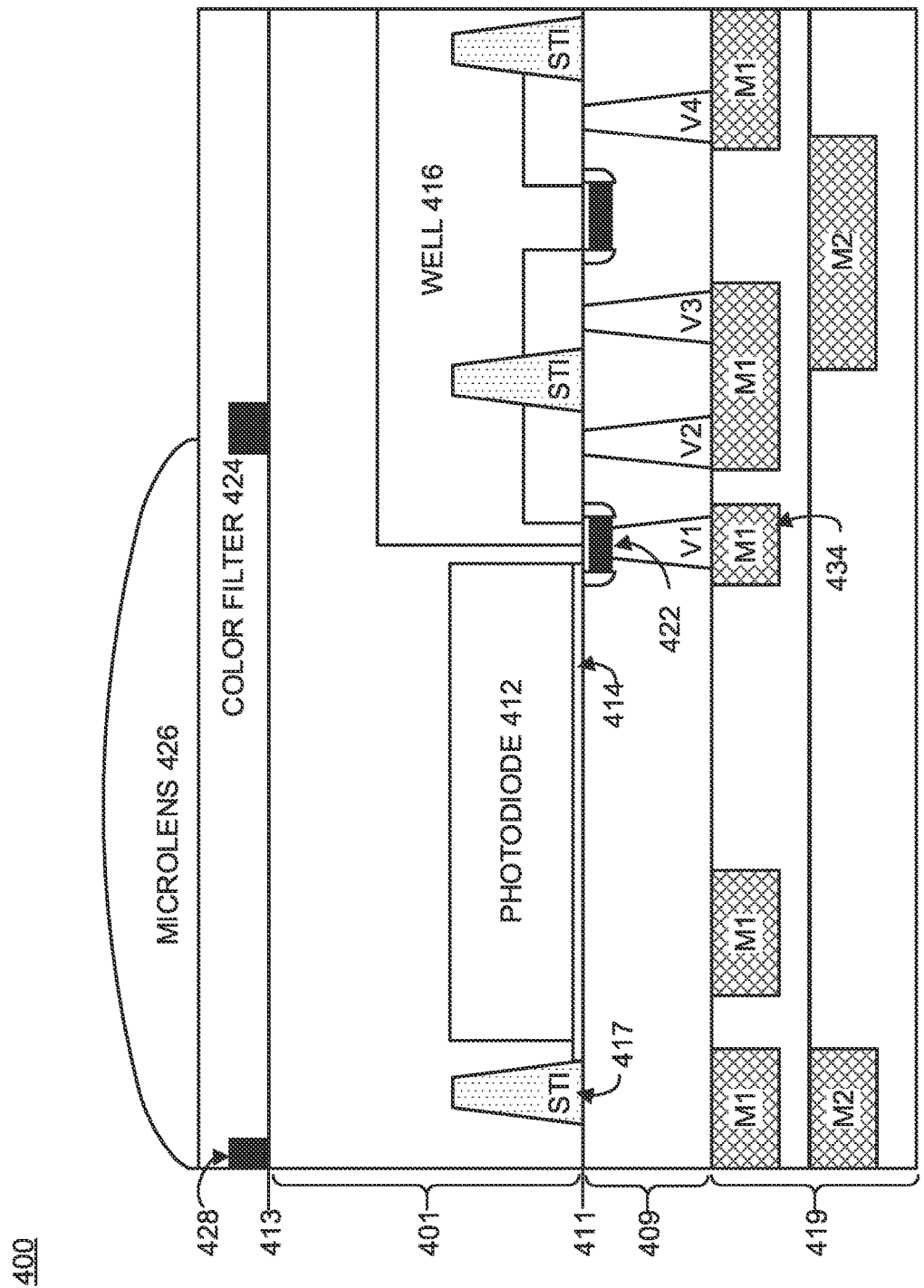
FIG. 4 illustrates an example cross-sectional view of a pixel included in an image sensor with an intermetal dielectric stack that interconnects one or more components associated with the pixel to one or more contact pads of the image sensor, in accordance with the teachings of the present disclosure.

FIG. 4 illustrates an example cross-sectional view of a pixel included in an image sensor with an intermetal stack that interconnects one or more components associated with the pixel to one or more contact pads of the image sensor, in accordance with the teachings of the present disclosure. Image sensor 400 is one possible implementation of the image sensor formed by process 100-A illustrated in FIG. 1A and may correspond to an individual pixel included in the pixel region 102 illustrated in FIGS. 1B-1I and FIGS. 2A-2D. As illustrated in FIG. 4, image sensor 400 includes like-labeled elements, including a semiconductor substrate 401 having a first side 413 and a second side 411, an interlayer dielectric 409, an intermetal dielectric stack 410, a photodiode 412, a pinning layer 414, a well 416, a plurality of STI structures 417, a plurality of gate electrodes 422 that are each respectively for a transistor (e.g., transfer, source-follower, reset, row select, or otherwise), a color filter 424, a microlens 426, and one or more metal layers 434 (e.g., M1 for metal layer 1, M2 for metal layer 2, and so on). In some embodiments, the interlayer dielectric 409 and the intermetal dielectric stack 410 are formed of silicon dioxide. In some embodiments, at least one of the one or more metal layers 434 is electrically coupled to a contact pad (e.g., contact pad 167 illustrated in FIG. 1I, contact pad 267 illustrated in FIG. 2D, or the like) to provide an electrical interconnect between one or more components of the illustrated pixel in FIG. 4 to the respective contact pad. In some embodiments, a metal grid 428 is formed within a color filter array to separate color filter 424 from other color filters included in the color filter array. In some embodiments, the metal grid 428 is formed in a buffer oxide layer (e.g., corresponding to dielectric or planarization layer 121 illustrated in FIGS. 1B-1I) to form one or more apertures aligned with the photodiode 412. In some embodiments, the color filter array containing the color filter 424 is formed above the metal grid 428.

Figure 5:
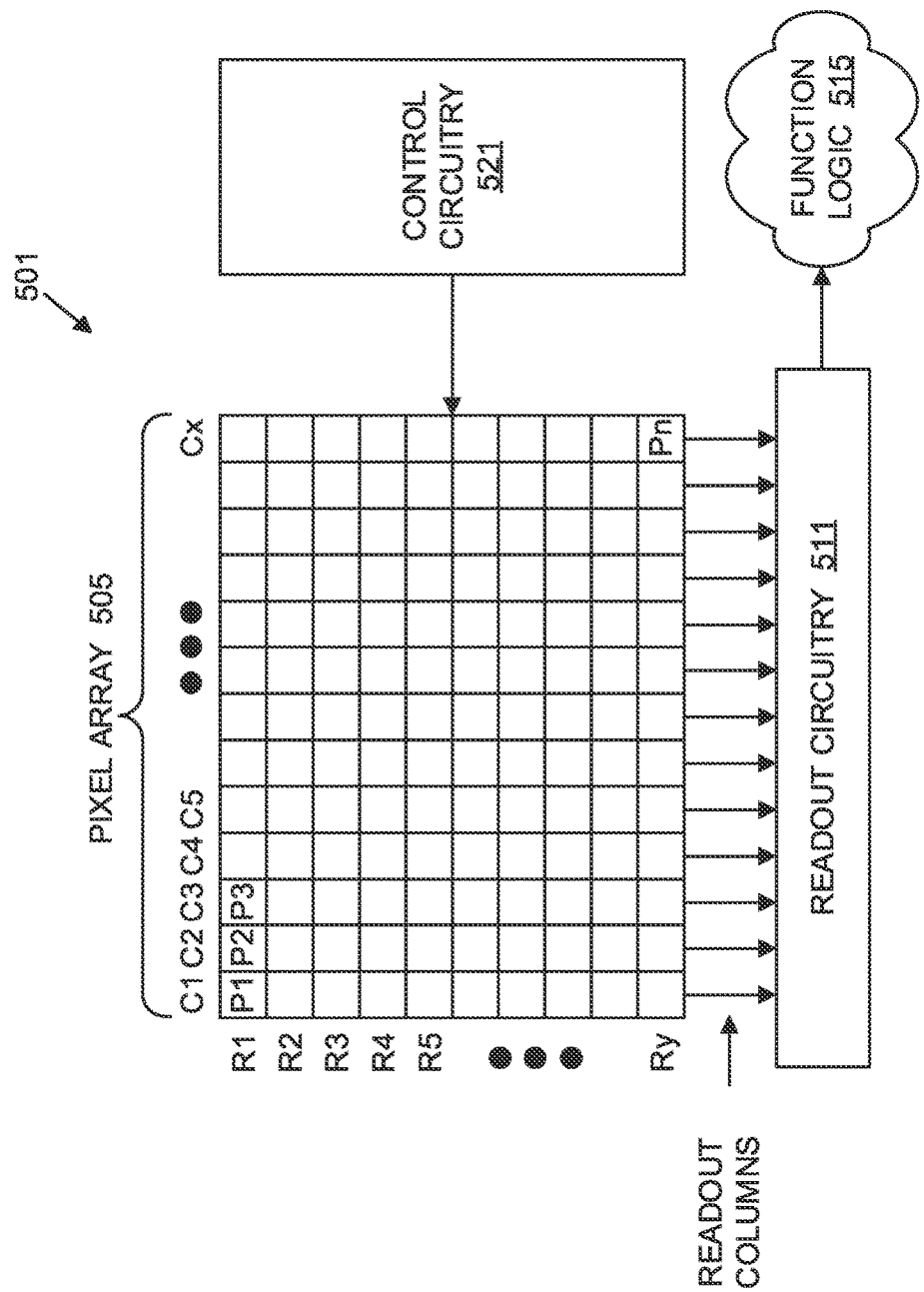
FIG. 5 illustrates an example block diagram of an imaging system including an image sensor formed by the process illustrated in FIG. 1A, in accordance with the teachings of the present disclosure.

FIG. 5 illustrates an example block diagram of an imaging system 500 including an image sensor 501 formed by process 100-A illustrated in FIG. 1A or any other embodiment described herein, in accordance with the teachings of the present disclosure. Image sensor 501 of imaging system 500 is one possible implementation of the image sensor illustrated in FIGS. 1B-1I, FIGS. 2A-2D, any one of the individual dies included in the plurality of dies 301, or image sensor 400 illustrated in FIG. 4. Imaging system 500 includes pixel array 505, control circuitry 521, readout circuitry 511, and function logic 515. In one embodiment, pixel array 505 is a two-dimensional (2D) array of photodiodes or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render an image or video of the person, place, object, etc. However, photodiodes do not have to be arranged into rows and columns and may take other configurations.

In one embodiment, after each image sensor photodiode/pixel in pixel array 505 has acquired its image data or image charge, the image data is readout by readout circuitry 511 and then transferred to function logic 515. In various examples, readout circuitry 511 may include amplification circuitry, analog-to-digital (ADC) conversion circuitry, or otherwise. Function logic 515 may simply store the image data or even manipulate the image data by applying post image effects (e.g., autofocus, crop, rotate, remove red eye, adjust brightness, adjust contrast, or otherwise). In the same or another embodiment, readout circuitry 511 may readout a row of image data at a time along readout column lines (illustrated) or may readout the image data using a variety of other techniques (not illustrated), such as a serial readout or a full parallel readout of all pixels simultaneously. In one embodiment, control circuitry 521 is coupled to pixel array 505 to control operation of the plurality of photodiodes in pixel array 505. For example, control circuitry 521 may generate a shutter signal for controlling image acquisition. In some embodiments, control circuitry 521 transmits signals to control operations of the plurality of photodiodes in pixel array 505 through a plurality of contact pads (e.g., contact pad 167, 263, 267) formed in a bonding pad (BPAD) region surrounding the pixel array.

It is appreciated that imaging system 500 may be included in a digital camera, cell phone, laptop computer, automobile, or the like. Additionally, imaging system 500 may be coupled to other pieces of hardware such as a processor (general purpose or otherwise), memory elements, output (USB port, wireless transmitter, HDMI port, etc.), lighting/flash, electrical input (keyboard, touch display, trackpad, mouse, microphone, etc.), and/or display. Other pieces of hardware may deliver instructions to imaging system 500, extract image data from imaging system 500, or manipulate image data supplied by imaging system 500.

It is further appreciated that while the block diagram illustrated in FIG. 5 shows pixel array 505, readout circuitry 511, function logic 515, and control circuitry 521 as distinct and separate elements from the pixel array, this is not necessarily the case as such features may be combined or otherwise incorporated with the pixel array directly (e.g., within and/or between individual pixels, in the form of stacked substrates, or otherwise). For example, the readout circuitry 511 may include one or more transistors (e.g., associated with 3T, 4T, 5T, or other pixel architectures for reading out image charge from individual pixels), elements of which may be disposed between segments of individual photodiodes in accordance with embodiments of the present disclosure. Furthermore, the image sensor 501 may include features not explicitly illustrated or discussed but known by one of ordinary skill in the art such as color filters, microlenses, a metal grid, and the like. Additionally, it is appreciated that image sensor 501 is fabricable by conventional CMOS manufacturing techniques known by one of ordinary skill in the art, which may include, but is not limited to, photolithography, chemical vapor deposition, physical vapor deposition, ion implantation or diffusion, thermal oxidation, reactive ion etching, wet chemical etching, chemical mechanical polishing, and the like.

The processes explained above may be implemented using software and/or hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

The invention claimed is:

1. A method for forming a contact pad of a semiconductor device, the method comprising:
    etching a first trench into a semiconductor substrate during a first etching step, wherein the semiconductor substrate includes a first side and a second side opposite the first side, wherein the semiconductor device includes a shallow trench isolation (STI) structure disposed between the first side and the second side of the semiconductor substrate, wherein the semiconductor device further includes an intermetal dielectric stack coupled to the second side of the semiconductor substrate, wherein the intermetal dielectric stack includes a first metal interconnect, and wherein the first trench extends from the first side of the semiconductor substrate to the STI structure;
    depositing a dielectric material into the first trench during a dielectric deposition step to form a dielectric spacer extending along side walls of the first trench;
    etching a second trench aligned with the first trench during a second etching step based, at least in part, on the dielectric spacer, wherein the second trench extends through the STI structure to the first metal interconnect;
    depositing a metal material into the second trench during a metal deposition step to form the contact pad, wherein the contact pad contacts the first metal interconnect; and
    depositing an etch stop layer before the dielectric material is deposited such that the etch stop layer is disposed between the dielectric material and the first side of the semiconductor substrate, wherein the etch stop layer has etching selectivity relative to subsequently deposited materials such that the etch stop layer has a lower etch rate relative to etch rates of the dielectric material and the metal material.

2. The method of claim 1, wherein a first width of the first trench is greater than a second width of the second trench, and wherein the second width is defined based on a difference between the first width and a thickness of the dielectric spacer.

3. The method of claim 2, further comprising:
    overlaying the etch stop layer with a pattern using a photomask for at least forming the first trench.

4. The method of claim 3, further comprising:
    anisotropically etching the dielectric material during an anisotropic etch step after the dielectric deposition step, wherein during the dielectric deposition step the dielectric material conformally coats the etch stop layer, the side walls of the first trench, and an exposed region of the STI structure, and wherein the anisotropic etch step removes the dielectric material coating the etch stop layer and the exposed region of the STI structure to form the dielectric spacer.

5. The method of claim 4, wherein the metal material at least partially fills the first trench and the second trench such that the metal material is laterally surrounded by the dielectric spacer, and wherein the metal material further extends over the etch stop layer such that the etch stop layer is disposed between the metal material and the first side of the semiconductor substrate.

6. The method of claim 5, further comprising:
    etching the metal material during a metal etch step to remove excess portions of the metal material contacting the etch stop layer and further remove a portion of the metal material laterally surrounded by the dielectric spacer in the first trench to form the contact pad; and
    removing the etch stop layer.

7. The method of claim 3, wherein the second etching step, which forms the second trench with the second width less than the first width of the first trench, is performed using the photomask and without any additional photomasks.

8. The method of claim 1, wherein the metal material conformally contacts the dielectric spacer to form a third trench disposed between metal side walls of the metal material.

9. The method of claim 8, further comprising:
    depositing a second etch stop layer into the third trench such that the second etch stop layer is disposed between the metal side walls of the metal material, wherein the metal material includes a first segment disposed between the second etch stop layer and the first metal interconnect, and wherein other segments of the metal material not disposed between the second etch stop layer and the first metal interconnect form the metal side walls;
    etching the other segments of the metal material to remove the metal side walls and form the contact pad, wherein the contact pad is disposed between the second etch stop layer and the first metal interconnect; and
    removing the second etch stop layer.

10. The method of claim 9, wherein a first height of the contact pad is less than a first depth of the second trench, and wherein the first depth of the second trench corresponds to a distance from the first metal interconnect to a first interface where the dielectric spacer contacts the STI structure.

11. The method of claim 1, wherein the semiconductor substrate corresponds a semiconductor wafer including a plurality of dies, each die included in the plurality of dies corresponding to an instance of the semiconductor device, and wherein each of the plurality of dies are separated from one another by scribe lines indicative of where to dice the semiconductor wafer.

12. The method of claim 11, wherein at least one die, included in the plurality of dies, includes a second contact pad disposed within a backside scribe line region of the at least one die, wherein the second contact pad is disposed proximate to at least one of the scribe lines, and wherein the second contact pad disposed within the backside scribe line region is formed simultaneously with the contact pad during the first etching step, the dielectric deposition step, the second etching step, and the metal deposition step.

13. The method of claim 11, wherein the semiconductor device is an image sensor.

14. The method of claim 1, wherein the metal material only partially fills the first trench.

15. The method of claim 1, wherein the etch stop layer includes a high-k dielectric material having a dielectric constant greater than silicon dioxide.

16. The method of claim 1, wherein the dielectric material includes silicon nitride.

17. The method of claim 1, wherein the dielectric material is different than the etch stop layer.

18. A method for forming a contact pad of a semiconductor device, the method comprising:
    etching a first trench into a semiconductor substrate during a first etching step, wherein the semiconductor substrate includes a first side and a second side opposite the first side, wherein the semiconductor device includes a shallow trench isolation (STI) structure disposed between the first side and the second side of the semiconductor substrate, wherein the semiconductor device further includes an intermetal dielectric stack coupled to the second side of the semiconductor substrate, wherein the intermetal dielectric stack includes a first metal interconnect, and wherein the first trench extends from the first side of the semiconductor substrate into the STI structure;

depositing a dielectric material into the first trench during a dielectric deposition step to form a dielectric spacer extending along side walls of the first trench, wherein the side walls of the first trench extend, at least in part, into the STI structure such that the STI structure is disposed between the semiconductor substrate and the dielectric material;

etching a second trench aligned with the first trench during a second etching step based, at least in part, on the dielectric spacer, wherein the second trench extends through the STI structure to the first metal interconnect; and depositing a metal material into the second trench during a metal deposition step to form the contact pad, wherein the contact pad contacts the first metal interconnect, wherein the first trench is etched through a dielectric layer during the first etching step, the dielectric layer including a metal grid embedded therein, wherein the dielectric spacer extends continuously through the dielectric layer until reaching the STI structure before and after the metal deposition step.

19. A method for forming a contact pad of a semiconductor device, the method comprising:

etching a first trench into a semiconductor substrate during a first etching step, wherein the semiconductor substrate includes a first side and a second side opposite the first side, wherein the semiconductor device includes a shallow trench isolation (STI) structure disposed between the first side and the second side of the semiconductor substrate, wherein the semiconductor device further includes an intermetal dielectric stack coupled to the second side of the semiconductor substrate, wherein the intermetal dielectric stack includes a first metal interconnect, and wherein the first trench extends from the first side of the semiconductor substrate to the STI structure;

depositing a dielectric material into the first trench during a dielectric deposition step to form a dielectric spacer extending along side walls of the first trench;

etching a second trench aligned with the first trench during a second etching step based, at least in part, on the dielectric spacer, wherein the second trench extends through the STI structure to the first metal interconnect;

depositing a metal material into the second trench during a metal deposition step to form the contact pad, wherein the contact pad contacts the first metal interconnect, wherein the metal material conformally contacts the dielectric spacer to form a third trench disposed between metal side walls of the metal material;

depositing a second etch stop layer into the third trench such that the second etch stop layer is disposed between the metal side walls of the metal material, wherein the metal material includes a first segment disposed between the second etch stop layer and the first metal interconnect, and wherein other segments of the metal material not disposed between the second etch stop layer and the first metal interconnect form the metal side walls;

etching the other segments of the metal material to remove the metal side walls and form the contact pad, wherein the contact pad is disposed between the second etch stop layer and the first metal interconnect; and removing the second etch stop layer.

\* \* \* \* \*